United States Patent
Predki

(10) Patent No.: US 11,545,213 B1
(45) Date of Patent: Jan. 3, 2023

(54) SYSTEMS AND METHODS FOR WRITING AND READING DATA STORED IN A POLYMER USING NANO-CHANNELS

(71) Applicant: IRIDIA, INC., Carlsbad, CA (US)

(72) Inventor: Paul F. Predki, Carlsbad, CA (US)

(73) Assignee: IRIDIA, INC., Carlsbad, CA (US)

( * ) Notice: Subject to any disclaimer, the term of this patent is extended or adjusted under 35 U.S.C. 154(b) by 0 days.

(21) Appl. No.: 17/396,439

(22) Filed: Aug. 6, 2021

Related U.S. Application Data

(60) Provisional application No. 63/063,066, filed on Aug. 7, 2020.

(51) Int. Cl.
| | | |
|---|---|---|
| G11C 13/00 | (2006.01) | |
| G11C 11/56 | (2006.01) | |
| H01L 51/05 | (2006.01) | |
| H01L 51/00 | (2006.01) | |
| H01L 27/28 | (2006.01) | |

(52) U.S. Cl.
CPC ...... *G11C 13/0019* (2013.01); *G11C 11/5664* (2013.01); *H01L 27/285* (2013.01); *H01L 51/0093* (2013.01); *H01L 51/0595* (2013.01)

(58) Field of Classification Search
None
See application file for complete search history.

(56) References Cited

U.S. PATENT DOCUMENTS

| | | | |
|---|---|---|---|
| 8,722,327 B2 | 5/2014 | Cao et al. | |
| 9,486,742 B1 * | 11/2016 | Rempe | B01D 69/142 |
| 9,725,315 B2 | 8/2017 | Austin et al. | |
| 10,438,662 B2 | 10/2019 | Predki | |
| 10,640,822 B2 | 5/2020 | Predki et al. | |
| 10,676,352 B2 | 6/2020 | Cao et al. | |
| 2020/0265890 A1 | 8/2020 | Predki et al. | |

OTHER PUBLICATIONS

Basu, AS., "Digital Assays Part I: Partitioning Statistics and Digital PCR," *SLAS Technol.*, Aug. 2017;22(4):369-386.
Liu et al., "Entropic cages for trapping DNA near a nanopore," *Nat Commun.* Feb. 4, 2015;6:6222.

* cited by examiner

*Primary Examiner* — James G Norman
(74) *Attorney, Agent, or Firm* — Hoxie & Associates LLC

(57) ABSTRACT

The disclosure provides a novel system and method of storing multi-bit information, including providing a nano-channel-based polymer memory device, the device having at least one memory cell comprising at least two addition nano-channels, each of the addition nano-channels arranged to add a unique chemical construct (or codes) to the polymer when the polymer enters the respective addition nano-channel, the polymer having a bead or origami on a non-writing end of the polymer; each nano-channel having a nano-port constriction having a port width which allows the polymer to pass through the nano-port, and does not allow the bead or origami to pass through and does not allow addition or deblocking enzymes (or beads attached thereto) to pass through the nano-port; successively steering the polymer through the nanopore into the addition nano-channels to add the codes to the polymer based on a predetermined digital data pattern to create the digital data pattern on the polymer.

7 Claims, 21 Drawing Sheets

Fig. 11

<u>4 Add-Chambers in Memory Cell</u>; 2-bit binary writing (00 to 11) <u>OR</u>
<u>Any set of 4 different (unique) codes or chemical items (e.g., G,C,A,T (DNA bases), or flowers, stars, dumbbells, etc.):</u>

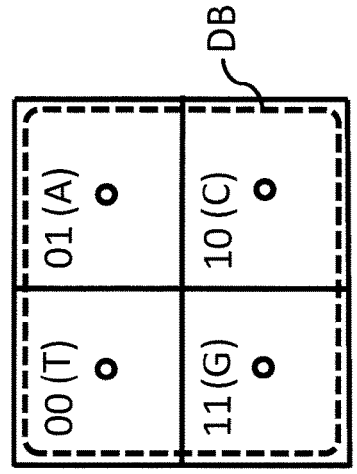

4 Add-Chamber Memory Cell

Rectangular Geometry

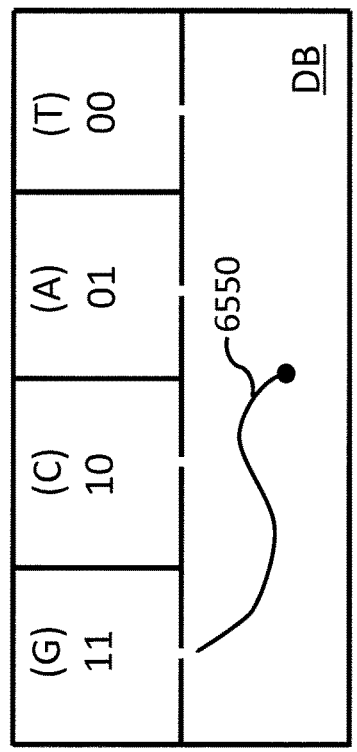

4 Add-Chamber Memory Cell

Square Geometry (top view)

- DNA (or other polymer "memory string") attached to a bead or origami or to bottom (or a wall) of de-block (DB) chamber (if long enough).
- Enables bulk writing of information/data, e.g., codes or multiple bit writing, with a single add-chamber reaction.
- Can be done for any number of unique add chambers in a given memory cell.
- Limited only by the number of unique chemical items or constructs (or monomers) that can be added or written to the memory string and that can be identified (read).

8 Add-Chamber Memory Cell ;
3-bit binary writing (000-111) OR
Any set of 8 different codes or chemical items (e.g., flowers, stars, dumbbells, etc.):

Addition using a "Y" nano-channel with "Nano-ports" (or constriction or restriction region)

("Star" / "Hub & Spoke")

"Star" Config. (Multi-Bit or Redundancy)

Parallel Channels (for Multi-Bit or Redundancy)

Y-channel "Modules" (for Multi-Bit and/or Redundancy)

Rounded Intersection

Circular

Polygon

U-Shaped

US 11,545,213 B1

SYSTEMS AND METHODS FOR WRITING AND READING DATA STORED IN A POLYMER USING NANO-CHANNELS

CROSS-REFERENCE TO RELATED APPLICATIONS

This application is a U.S. non-provisional application filed under 35 U.S.C. 111(a), which claims priority to, and the benefit of, U.S. Provisional Application No. 63/063,066, filed on Aug. 7, 2020, the contents of which are hereby incorporated by reference in its entirety.

FIELD

The invention relates to novel methods and systems for information storage and retrieval, using nano-based devices.

BACKGROUND

There is a continuing demand to store ever more data on or in physical media, with storage devices getting ever smaller as their capacity gets bigger. The amount of data stored is reportedly doubling in size every two years, and according to one study, by 2020 the amount of data we create and copy annually will reach 44 zetabytes, or 44 trillion gigabytes. Moreover, existing data storage media such as hard drives, optical media, and magnetic tapes, are relatively unstable and become corrupted after prolonged storage.

There is an urgent need for alternative approaches to storing large volumes of data for extended periods, e.g., decades or centuries.

BRIEF DESCRIPTION OF THE DRAWINGS

The present invention will become more fully understood from the detailed description and the accompanying drawings, wherein:

FIG. 11 shows a 4 add-chamber memory cell and an alternative square geometry top view, and corresponding two-bit binary codes or DNA bases codes, in accordance with embodiments of the present disclosure.

FIG. 20A shows an array of Y nano-channels of FIG. 20 having separate deblock/load channels, in accordance with embodiments of the present invention.

FIG. 21A shows an array of Y nano-channels of FIG. 21 having separate deblock/load channels, in accordance with embodiments of the present invention.

FIG. 22A shows an array of stacked Y nano-channels of FIG. 22 having separate deblock/load channels, in accordance with embodiments of the present invention.

DETAILED DESCRIPTION

The following description of the preferred embodiment(s) is merely exemplary in nature and is in no way intended to limit the invention, its application, or uses.

The following commonly-owned issued patents and pending patent applications contain subject matter related to that described herein, each of which are hereby incorporated by reference in their entirety to the extent permitted by applicable law: U.S. Pat. Nos. 10,438,662; 10,640,822; and U.S. patent application Ser. No. 16/866,364 filed May 2, 2020.

The aforementioned commonly-owned patents and patent applications discuss approaches for writing (or storing) and reading data stored in a polymer, e.g., DNA.

Figure 1:
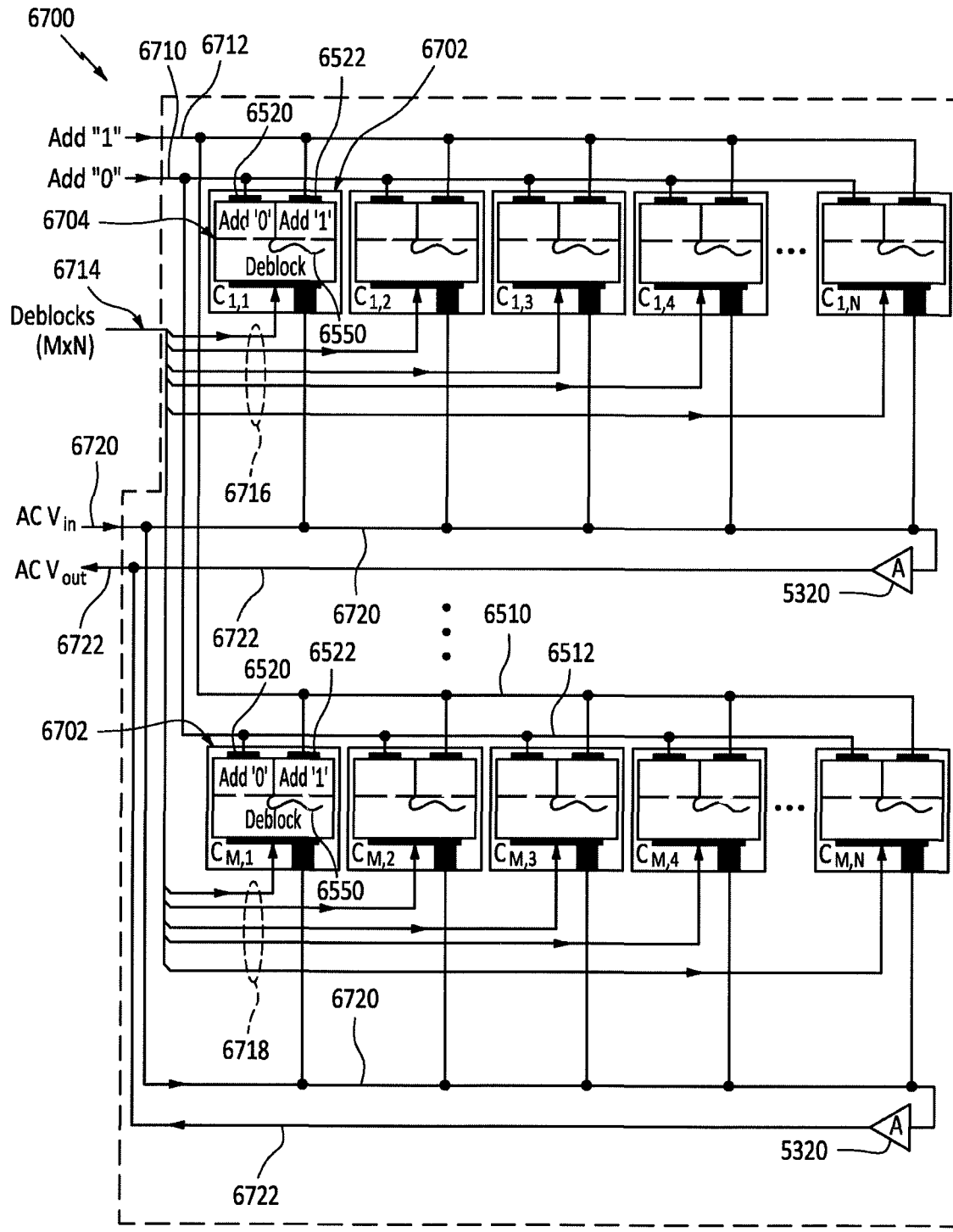
FIG. 1 is a circuit block diagram of an array of nanopore memory cells, in accordance with embodiments of the present disclosure.

Referring to FIG. 1, a schematic circuit block diagram of a nanopore-based "memory chip" 6700, is shown for embodiments of the present disclosure. In particular, the memory chip 6700 may have a plurality of nanopore-based "memory cells" 6702 (or "storage cell" or "data storage cell"), each having the ability to store data. Each of the "memory cells" 6702 has a multi-chamber nanopore-based fluidic cell 6704 with a cell structure similar to that discussed in the aforementioned commonly-owned patents and patent applications (which are incorporated by reference) (e.g., having a membrane with a nanopore and a "memory string" 6550 (e.g., DNA or other polymer, as discussed in the aforementioned commonly-owned patents and patent applications). The "memory cells" 6702 may also include any solid-state or semiconductor passive or active circuitry or chip layers or components, which interface with the fluidic cell portion 6704 to provide the data storage (or writing or adding) and/or data retrieval (or reading or sequencing) functions described herein.

Figure 2:
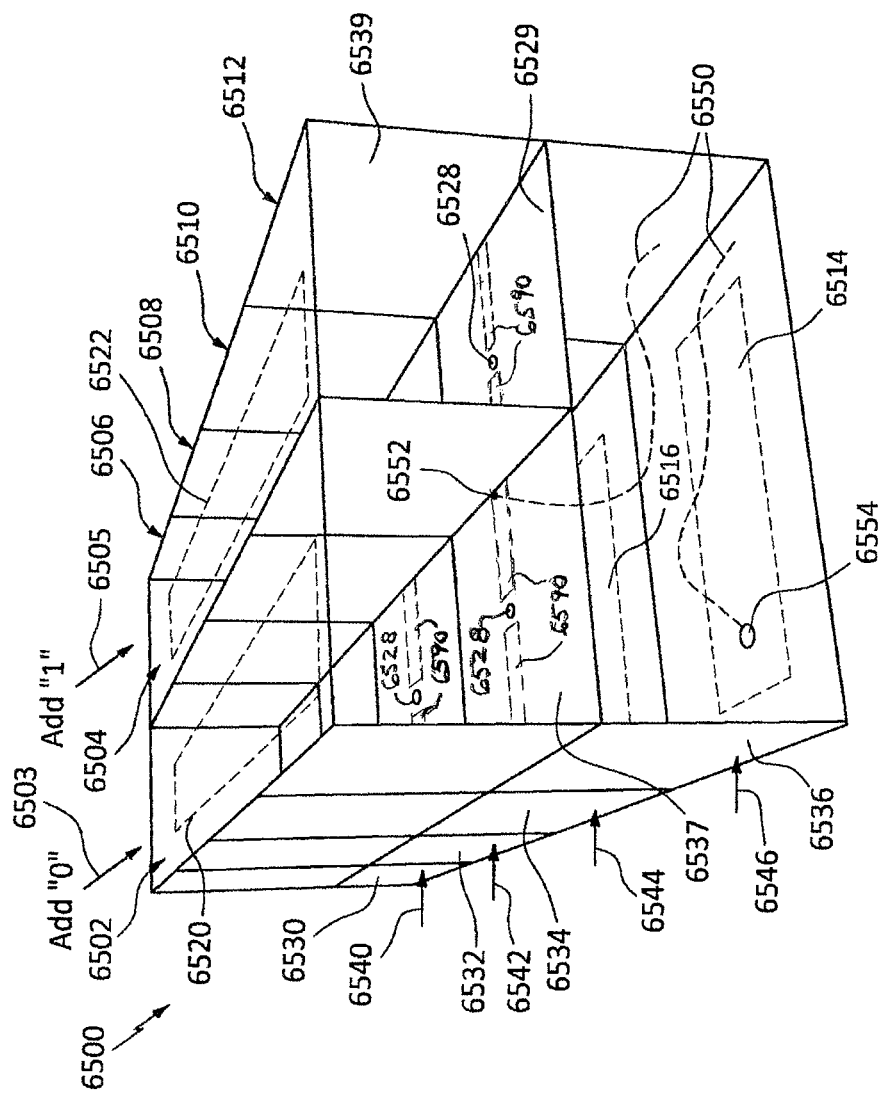
FIG. 2 is a partial perspective view of a group of connected 3-chamber cell nanopore devices having a transparent top and electrodes, in accordance with embodiments of the present disclosure.
Figure 3:
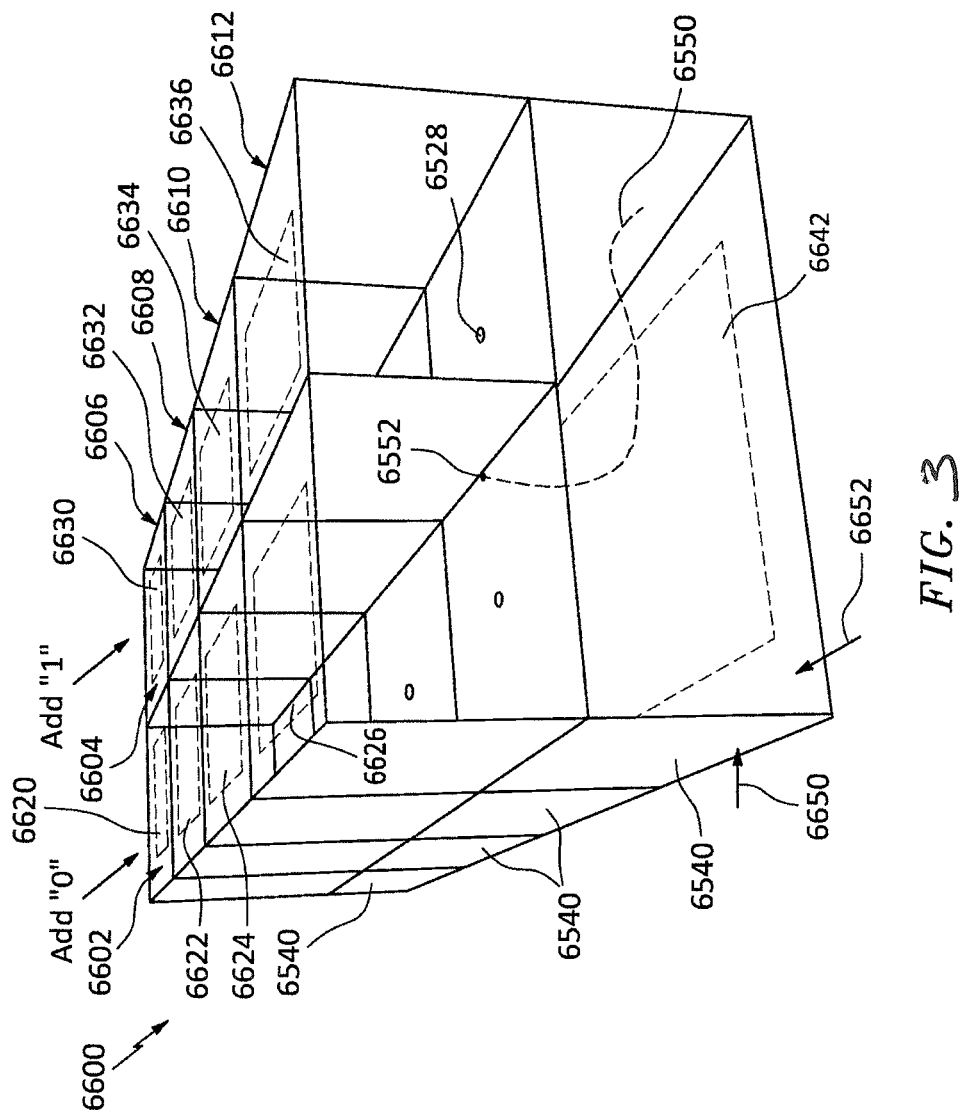
FIG. 3 is a partial perspective view of an alternative embodiment of a group of connected 3-chamber cell nanopore devices having a transparent top and electrodes, in accordance with embodiments of the present disclosure.

The memory cells 6702 may be connected together (electrically and fluidically), such as 3-chamber memory cells having common fluidic "Add" channels and common "Add" electrodes, and independent "deblock" chambers, such as is shown in FIG. 2, and described in the aforementioned commonly-owned patents and patent applications. Any number of chambers and any cell configurations described herein may be used if desired. In some embodiments, the memory cell may be configured as shown in FIG. 3, which is described in the aforementioned commonly-owned patents and patent applications regarding FIG. 65 thereof.

The "memory cells" 6702 may be configured as an M×N array of memory cells, with M rows and N columns, each of the cells 6702 being labeled $C_{M,N}$. More specifically, the cells 6702 in the first row are labeled $C_{1,1}$-$C_{1,N}$, and the cells 6702 in the last row are labeled $C_{M,1}$-$C_{M,N}$. M and N may be any values that provide the desired functions and performance, and M,N may each be as small a 1 and as large as 1 million, 10 million, 100 million, 1 billion, or 1 trillion, or larger, depending on the desired footprint size of the memory chip and the size of each memory cell.

The memory chip 6700 has an Add "0" input DC voltage on line 6710, which is electrically connected (directly or through on-chip circuitry or components, as described herein) to each of the Add "0" electrodes. The Add "0" input DC voltage on the line 6710 drives the Add "0" electrode to the desired voltage state (discussed herein), to help position (or move or steer) the memory string 6550 (DNA or other polymer, as discussed herein) to the desired chamber of the fluidic cell 6704. In this configuration, all the Add "0" electrodes for each of the memory cells are shared or common, or electrically connected, as shown in FIG. 2.

The memory chip 6700 also has an Add "1" input DC voltage on line 6712 which is electrically connected (directly or through on-chip circuitry or components as described herein) to each of the Add "1" electrodes. The Add "1" input DC voltage on the line 6710 drives the Add "1" electrode to the desired voltage state (discussed herein), to help position (or move or steer) the memory string 6550 (DNA or other polymer, as discussed herein) to the desired chamber of the fluidic cell 6704. In this configuration, all the Add "1" electrodes 6522 for each of the memory cells is shared or common, as shown in FIG. 2.

The memory chip 6700 also has a "Deblock" input DC voltage on a plurality of lines (or bus) 6714, each of which is electrically connected (directly or through on-chip circuitry or components as described herein) to a corresponding "deblock" electrode in each of the cells 6702. The deblock input DC voltage drives the corresponding deblock electrode for a given cell to the desired voltage state (discussed herein), to help position (or move or steer) the memory string 6550 (DNA or other polymer, as discussed herein) to the desired chamber of the fluidic cell 6704. In this configuration, each of the deblock electrodes are independently driven, as shown in FIG. 2, thus the need for the deblock plurality of electrical connections or bus (or deblock bus) 6714. Each row of memory cells 6702 will have a corresponding number of deblock input DC voltage lines provided. For example, the first row there is a set of N deblock lines 6716 feeding the N cells 6702 in that row, and in the last row M, there is a separate set of N deblock lines 6718 feeding the N cells 6702 in the row M.

The DC input voltages Add "0", Add "1", and deblock, on the lines 6710, 6712, 6714, respectively, may be referred to herein as DC "steering" voltages $V_{ST}$ (or polymer or DNA steering voltages or memory string steering voltages) as they are used to "steer" the polymer memory string to the appropriate chamber of the fluidic cell 6704 at the appropriate time to achieve the desired result, e.g., write or add a "0" or "1" onto the memory string, or do nothing, or move the memory string to a particular chamber to enable writing or reading data, or perform validation testing, or the like. DC input voltages Add "0", Add "1", and deblock, on the lines 6710, 6712, 6714, respectively, may be provided from a computer-based controller circuit or logic or device, as described herein, which has the appropriate logic to perform the functions described herein.

The memory chip 6700 also has an AC input voltage Vin, and an AC output voltage Vout, on line 6720, 6722, respectively. The AC input voltage Vin on the line 6720 is electrically connected, as described herein, to each of the memory cells 6702 in parallel. The AC Vin provides an AC signal, e.g., rf or radio frequency signal, on the line 6720 to each of the memory cells 6702 and the memory cells are configured to be a resonator or nanopore polymer resonator (NPR), each having a different frequency response to the input AC Vin, as discussed in the aforementioned commonly-owned patents and patent applications. The line 6720 may connect the memory cell 6702 and/or the electronic components on the chip, the electrodes, and the fluidic cell 6704 therein, differently from that shown in FIG. 1, depending on the circuit configuration used for the nanopore polymer resonator (NPR), fluidic cell configuration, electrode configuration, or other factors, as described herein. The AC input voltage Vin on the line 6720 may be provided from a computer-based controller circuit or logic or device, as described herein, which has the appropriate logic to provide the appropriate AC input voltage Vin and perform the functions described in the aforementioned commonly-owned patents and patent applications.

The combined frequency response from each of the memory cell 6702 may be provided to an on-chip amplifier (or pre-amp) 5320 (as described in the aforementioned commonly-owned patents and patent applications with regard to FIG. 53 therein), which provides the AC output voltage Vout on the line 6722 indicative of the combined frequency response. The AC output voltage Vout on the line 6722 may be provided to a computer-based processing circuit or logic or device, which has the appropriate logic, e.g., analog-to-digital (A/D) conversion and digital signal processing (DSP) logic, as described herein, which reads the data stored on the memory string 6550 and may perform other functions as described in the aforementioned commonly-owned patents and patent applications. Other reading techniques may be used if desired, such as dc bias current measurement, as described in the aforementioned commonly-owned patents and patent applications.

In some embodiments, the nanochips can be fabricated for example as depicted in FIGS. 23-29 in the aforementioned commonly-owned patents and patent applications. For example, in one format, each polymer strand is associated with two or four addition chambers, wherein the two addition chamber format is useful for encoding binary code in the polymer, and the four addition chamber format is particularly useful for making custom DNA sequences. Each addition chamber contains a separately controllable electrode. The addition chambers contain reagents to add monomers to the polymer in buffer. The addition chambers are separated by a membrane comprising one or more nanopores from a reserve chamber, which may be common to multiple addition chambers, and which contains deprotection reagents and buffer, to deprotect the protected monomers or oligomers added in the addition chambers. The nanochips comprise a multiplicity of addition chamber sets, to allow parallel synthesis of many polymers.

In some embodiments, the invention provides a method for storing and reading data on a polymer in situ in a nanopore-based chip, comprising:
 a) a cell having at least three chambers, including an Add "1" chamber arranged to add a "1" bit to the polymer and an Add "0" chamber arranged to add a "0" bit to the polymer, and a "deblock" chamber arranged to enable the polymer to receive the "1" bit and "0" bit when the polymer enters the Add "1" or Add "0" chambers, respectively;
 b) successively steering the polymer from the "deblock" chamber through the nanopore to the Add "1" chamber or to the Add "0" chamber based on a predetermined digital data pattern to create the digital data pattern on the polymer; and
 c) reading the digital data stored on the polymer as it passes through the nanopore using a resonance frequency response of a nanopore-polymer resonator (NPR) on the chip, or a dc bias current change or other detection technique, which are described in the aforementioned commonly-owned patents and patent applications, or any other detection technique.

In some embodiments of the present disclosure, the Add chambers and Deblock chamber may be "legs" of a Y nano-channel, as discussed hereinafter.

Figure 4:
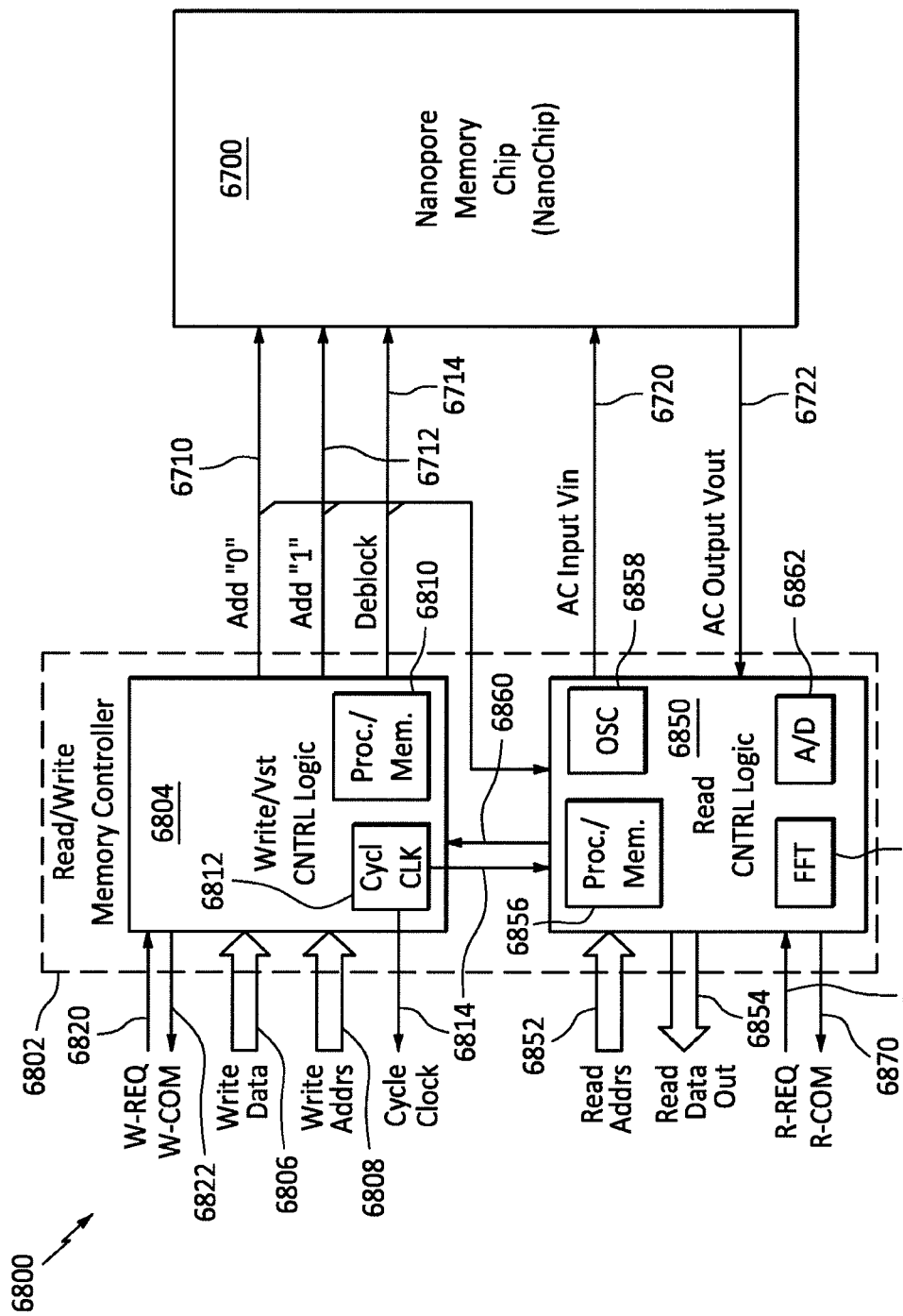
FIG. 4 is a block diagram of a read/write memory controller and a nanopore memory chip, in accordance with embodiments of the present disclosure.

Referring to FIG. 4, a top level hardware block diagram is shown of a read/write memory storage system 6800 having the nanopore-based memory chip 6700 (FIG. 1) and a memory read/write controller 6802, in accordance with embodiments of the present disclosure and as described in the aforementioned commonly-owned patents and patent applications. In particular, the memory read/write controller 6802 may have a write controller logic 6804, which receives input data to be written to the memory chip 6700 on lines and an address to store the data (or label or pointer or the like) on lines 6808, and provides the DC steering voltages Add "0", Add "1", and deblock, on the lines 6710, 6712, 6714, respectively, to the nanopore memory chip 6700. The write controller 6804 has the appropriate hardware, software and firmware (including any microprocessor or micro-computer based processor chips or devices and/or memory storage) as needed to provide the functions described herein, as indicated by a Proc./Mem. box 6810.

In addition, the write controller 6804 may also provide a write (or add) cycle clock 6812 (or oscillator), which determines when the memory chip 6700 writes (or adds or stores) "0" or "1" bits. In particular, the write controller chip 6804 provides the DC steering voltages (Add "0", Add "1", Deblock) based on the write cycle clock 6812 to cause the memory chip 6700 to write "1" or "0" to the memory cells. As discussed herein above with FIG. 2, in certain cell configurations, such as when all the Add "0" electrodes are connected together and, separately, all the Add "1" electrodes are connected together, and the deblock electrodes are individually controlled (such as in FIG. 2), the writing (or adding) of data bits may occur in write (or add) "cycles," such as an Add "0" cycle, when all the cells that need to write a "0" may be written at the same time, followed by an Add "1" cycle, when all the cells that need to write a "1" may all be written at the same time. The write cycle clock provides a write cycle signal on a line 6814 to enable the write requesting device or platform or computer bus, to determine the writing status of the memory chip. Other data writing cycles, timing, or approaches may be used if desired.

In some embodiments, the write controller 6804 may also receive control signals from the system or computer bus, such as a Write Request (W-REQ) signal on a line 6820 to request certain data be written to the memory chip 6700, and the write controller 6804 may also provide a Write (or Add) Complete (W-COM) signal on a line 6822, to indicate when the requested data has been written to the memory chip 6700.

The memory read/write controller 6802 may also have memory read controller logic 6850, which may receive a read address (or label or pointer or the like) on lines 6852 corresponding to the storage location of the data desired to be read from the memory chip 6700, and provides the requested data read from the memory chip 6700, on the lines 6854. The read controller 6850 may also have the necessary logics and components to provide the AC input voltage signal Vin to the memory chip 6700 on the line 6720. The AC input voltage Vin, as described herein, is an AC rf (radio frequency) signal that has frequency components corresponding to the bandwidth of the nanopore resonators (NPRs) in the memory chip 6700. To provide the Vin signal, the read controller 6850 may have a frequency oscillator logic 6858 (programmable or non-programmable), which provides the necessary frequency components (discussed herein) to enable the read controller logic to read the requested data from the nanopore memory chip 6700. As discussed herein, the AC Vin signal may be directly synthesized, combine multiple probe frequencies, and may be a single broadband signal, or a time swept or stepped frequency signal, or any other AC signal the provides the functions described herein as described in the aforementioned commonly-owned patents and patent applications.

The read controller 6850 also receives the output AC Vout voltage from the memory chip 6700 on the line 6722, and performs A/D conversion and digital signal processing (e.g., using on-board A/D conversion logic 6862 and FFT logic 6864), as discussed herein or in the aforementioned commonly-owned patents and patent applications, on the Vout signal to determine the values of the desired data at the specified read address and provide the output data on Read Data Out the lines 6854.

The read controller 6850 has the appropriate hardware, software and firmware (including any microprocessor or micro-computer based processor chips or devices and/or memory storage) as needed to provide the functions described herein or as described in the aforementioned commonly-owned patents and patent applications, as indicated by a Proc./Mem. box 6856.

In addition, the read controller 6850 may also receive the write (or add) cycle clock signal on the line 6814 from the write cycle clock 6812 (or oscillator), which, as discussed above, determines when the memory chip 6700 will write (or add or store) "0" or "1" bits. In particular, controller chip 6804 will provide the DC steering voltages (Add "0", Add "1", Deblock) based on the write cycle clock 6812 to cause the memory chip 6700 to write "1" or "0" to the memory cells. Because the act of writing with the present disclosure requires the DNA (or polymer or memory string) to pass through the nanopore to enter the desired chamber to Add bits and also to pass through the nanopore when exiting back to the deblock chamber, the write cycle clock signal may also be used by the read controller 6850 to determine when is the best time to read the data, as discussed with FIG. 69 in the aforementioned commonly-owned patents and patent applications.

In some embodiments, the read controller may provide a read signal 6860 to the write controller 6804 to request the controller 6804 provide the necessary steering voltages (Add "0", Add "1", Deblock) on the lines 6710-6714 to cause the memory string 6550 (FIG. 1) to pass through the nanopore to enable reading of the memory string.

In some embodiments, the read controller 6850 may also receive a Read Request (RD-REQ) signal on a line 6870 to request certain data be read from the memory chip 6700, and the read controller 6850 may also provide a Read Complete (RD-COM) signal on a line 6822, to indicate when the requested data has been read from the memory chip 6700. The Memory Controller 6802 may perform only one function, e.g., read or writing to the nanopore chip if desired, or it may perform both of these functions (Read and Write), if desired.

Figure 5:
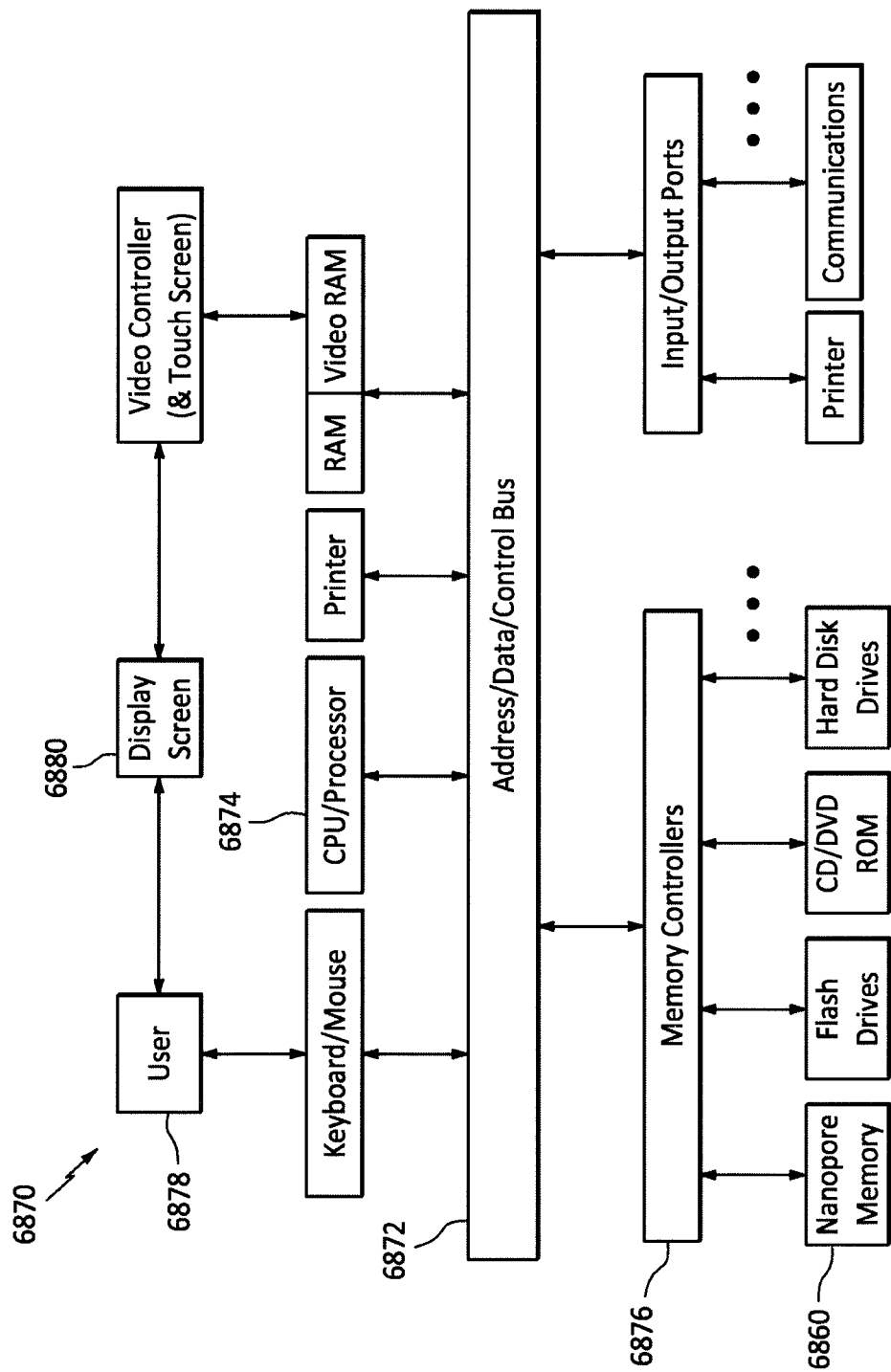
FIG. 5 is a block diagram of a computer system, in accordance with embodiments of the present disclosure.

Referring to FIG. 5, the Nanopore memory system 6800 may be part of a larger computer system which may interact with an Address/Data/Control Bus 6870, and may also interact with separate memory controllers 6876, all of which interact with one or more CPU/Processors 6874. For example, one or more of the read/write address and/or data inputs, outputs and/or control lines, such as numerals 6820, 6822, 6806, 6808, 6814, 6852, 6854, 6872, 6870, shown in FIG. 4, may be received from or provided to the bus 6872 or the memory controller 6876. The computer system 8670 may interface with a user 6878 and a display screen 6880.

Figure 6:
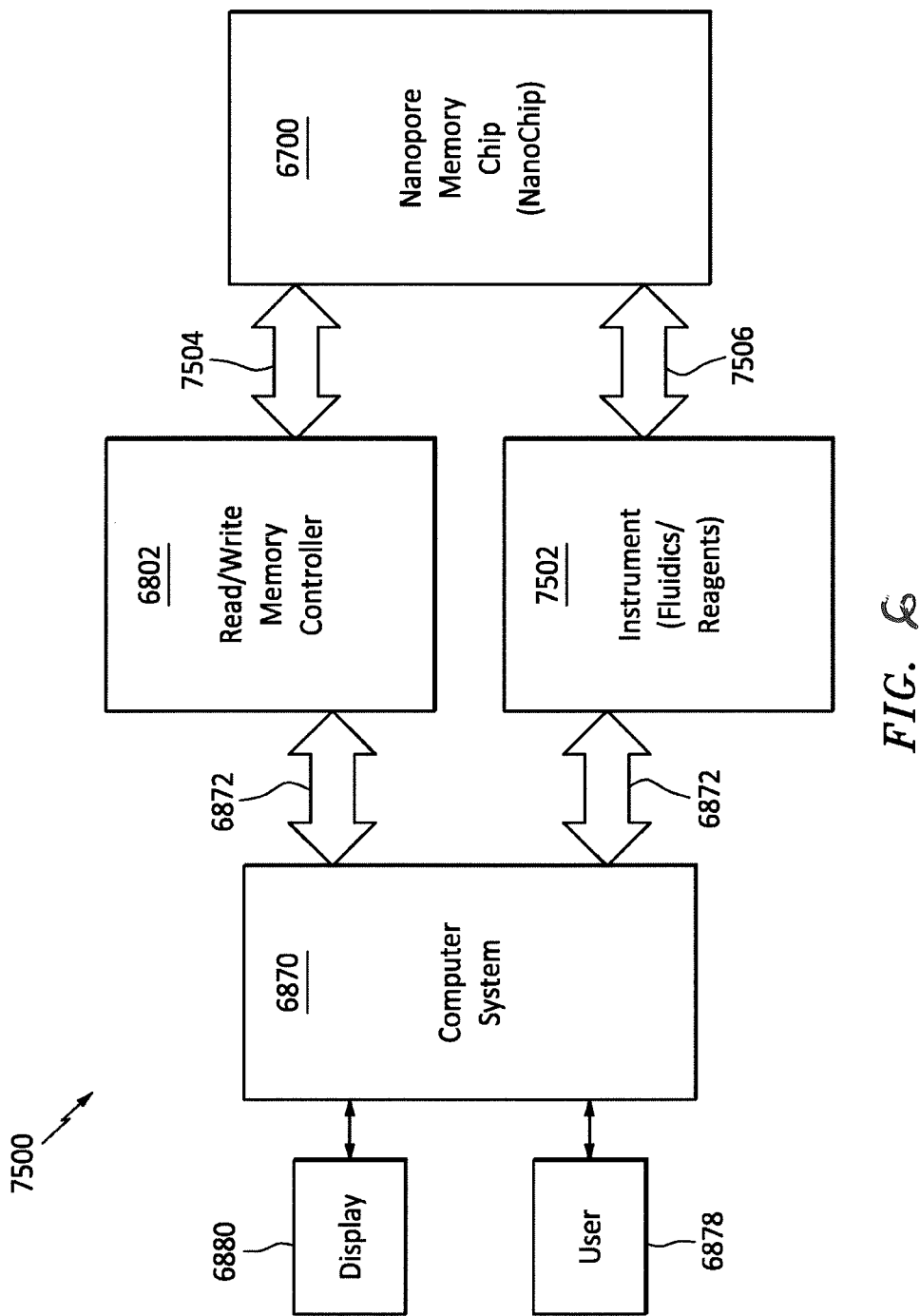
FIG. 6 is a block diagram showing a nanopore memory system showing a read/write memory controller and an instrument for fluidics/reagents, in accordance with embodiments of the present disclosure.

Referring to FIG. 6, the nanopore chip 6700 (FIG. 1) may interact with the read/write memory controller 6802, as discussed herein above with FIG. 4, which may control the voltages (AC and DC) to steer or control the polymer to Add bits and or read the bits on the memory string as shown collectively by lines 7504. The memory chip 6700 may also interface with an instrument 7502 on lines 7506, which may provide fluidics to the memory chip, such as filling the chip with buffers, enzymes, and/or polymers or DNA (or other memory strings), as discussed herein. The Instrument 7502 and the Memory Controller 6802 may be controlled or receive commands from a Computer System 6870, such as that described and shown with FIG. 5, that may interact with the user 6878 and may have the display 6880. The computer system 6870 may interact with the Read/Write Memory Controller 6802 and the Instrument 7502 via the computer bus 6872 (FIG. 4). The instrument 7502 has the necessary electronics, computer processing power, interfaces, memory, hardware, software, firmware, logic/state machines, databases, microprocessors, communication links, displays or other visual or audio user interfaces, printing devices, and any other input/output interfaces, including sufficient fluidic and/or pneumatic control, supply and measurement capability to provide the functions or achieve the results described herein.

Figure 7:
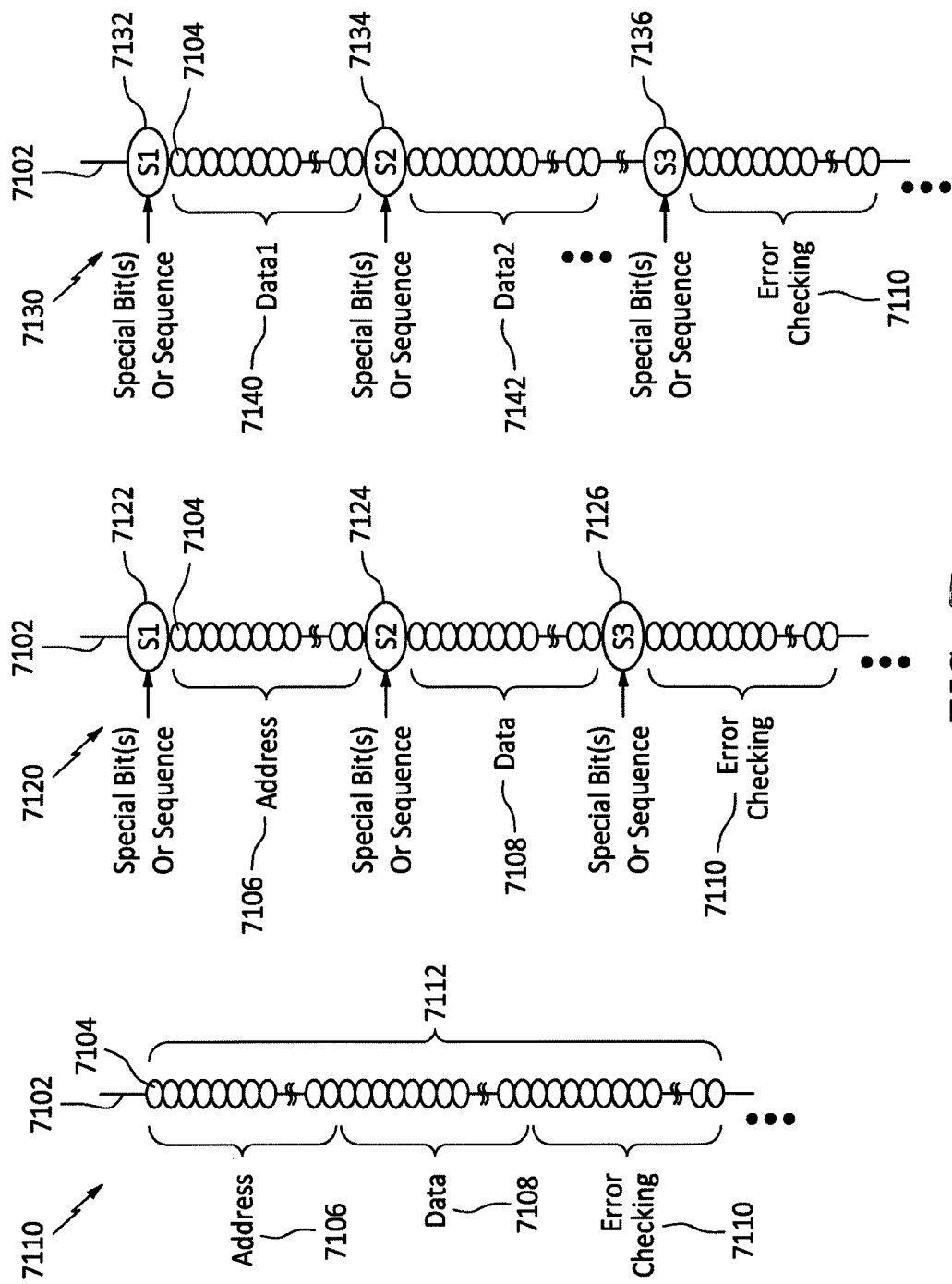
FIG. 7 shows three different data format listings of the bits on a memory string, in accordance with embodiments of the present disclosure.

Referring to FIG. 7, the format of how data is stored may vary based on various factors and design criteria. In particular, the "memory string" (or DNA or polymer) 6550 may be shown as a line 7102 on which are a series of ovals 7104, indicative of individual "bits" written (or added) onto the memory string 6550 in a given memory cell. In some embodiments, the bits 7104 may be written one after the other to build a "storage word" 7112. A first example data format 7110 shows three components to the storage word 7112, an address section 7106, a data section 7108, and an error checking section 7110. The address section 7106 is a label or pointer used by the memory system to locate the desired data. Unlike traditional semiconductor memory storage where hardware address lines on a computer memory bus would address a unique memory location, the memory chip and system of the present disclosure require the address (or label) to be part of the data stored and indicative of where the data desired to be retrieved is located. In the examples shown in FIG. 7, the address is located proximate to or contiguous with the data, as well as error checking data, such as parity, checksum, error correction code (ECC), cyclic redundancy check (CRC), or any other form of error checking and/or security information, including encryption information. In the storage word 7112, each of the components Address 7106, Data 7108, Error Checking 7110, are located after each other in the memory string. As each of the components have a known length (number of bits), e.g., address=32 bits, data=16 bits, error check=8 bits, each storage word 7112 and its components can be determined by counting the number of bits.

Another example data format 7120 shows the same three components, address section 7106, data section 7108, and error checking section 7110. However, in between each of the sections there is a "special bit(s) or sequence" sections S1,S2,S3, shown as numerals 7122,7124,7126, respectively. These special bits S1,S2,S3 may be a predetermined series of bits or code that indicate what section is coming next, e.g., 1001001001 may indicate the address is coming next, whereas 10101010 may indicate the data is coming next, and 1100110011 may indicate the error checking section in next. In some embodiments, the special bits may be a different molecular bit or bit structure attached to the string, such as dumbbell, flower, or other "large" molecular structure that is easily definable when it passes through the nanopore. Instead of it being large it may have other molecular properties that provide a unique change the capacitance or resonance different from the 1 bits and 0 bits, as discussed herein above.

Another example data format 7130 shows only Data components 7140 with no address component, and an error checking component 7110. In this structure, the string holds only the "Data" components and no Address components, which may be stored in other strings, as discussed hereafter. In this example there are also Special bits S1,S2,S3, shown as numerals 7132,7134,7136, respectively. Similar to the example 7120, these special bits S1,S2,S3 may be a predetermined series of bits or code that indicate the separation between data sections (e.g., the beginning or end of a data string or data section) and indicate when an error checking section is next, or may be a different molecular bit or bit structure attached to the string that is easily definable (or identifiable) when it passes through the nanopore, as discussed herein above.

Figure 8:
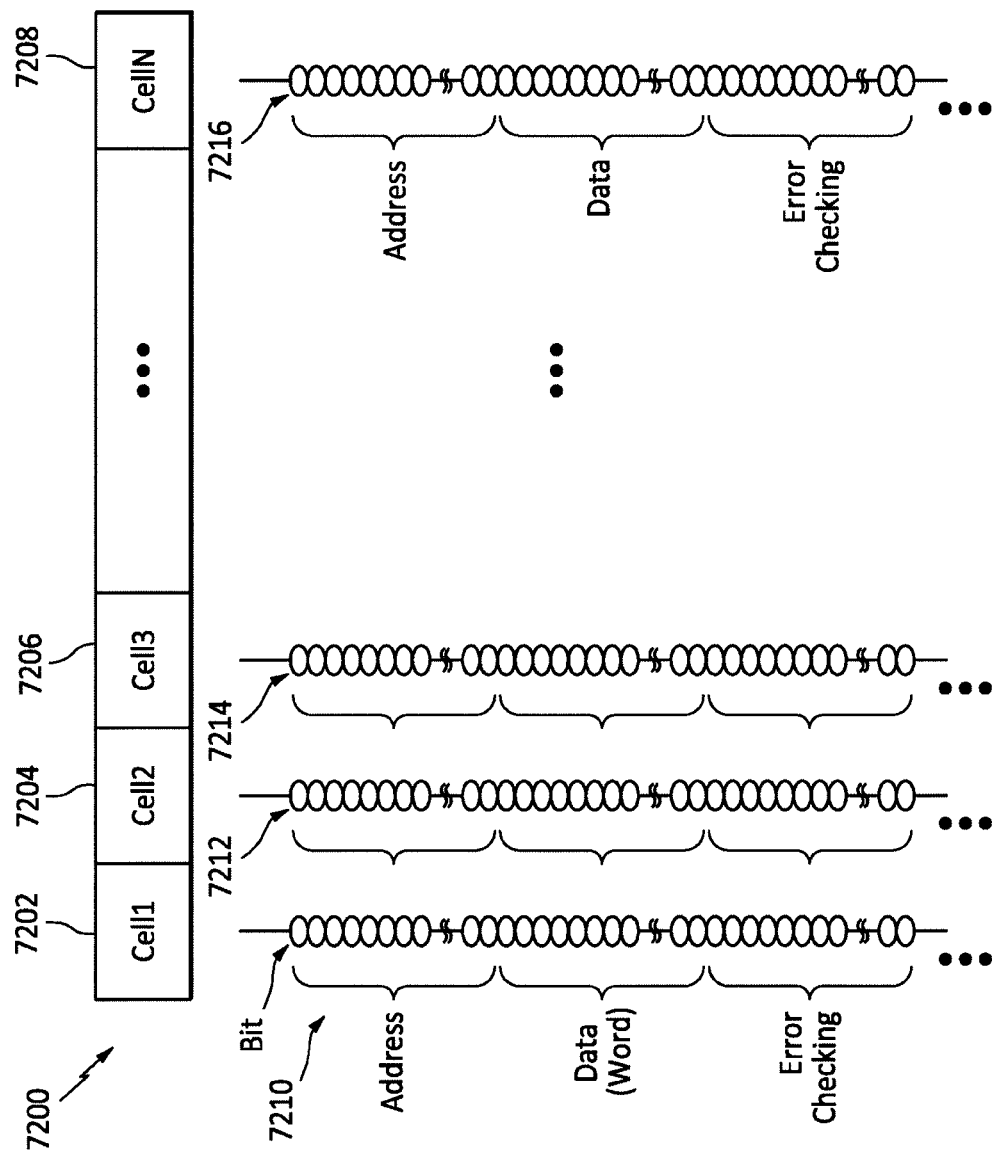
FIG. 8 shows a data format listing of the bits on a memory string for each cell in a row, in accordance with embodiments of the present disclosure.

Referring to FIG. 8, a single row of memory cells 7202-7208 (Cell1 to CellN) is shown, with a sample memory string 7210-7216, respectively, associated with each cell. The memory system of the present disclosure is significantly different from traditional semiconductor memory because instead of each memory cell storing a single bit of information (1 or 0), each memory cell of the present disclosure can store a significant amount of data (i.e., a "string" of data or "data string" or "memory string"). Thus, if a traditional semiconductor memory is viewed as a 2D array, the present memory system may be viewed as a 3D array, where each memory cell location in the memory cell array has significant storage depth. This provides a large range of options for how to store data and retrieve data.

For the example shown in FIG. 8, each cell may store a linear self-contained string of information (storage word), similar to that discussed in the example 7110 of FIG. 7. In that case, each storage word is stored back-to-back on top of other storage words. And each of the cells 7202-7208 in the row replicates this structure, and this may be repeated for multiple rows (not shown).

Figure 9:
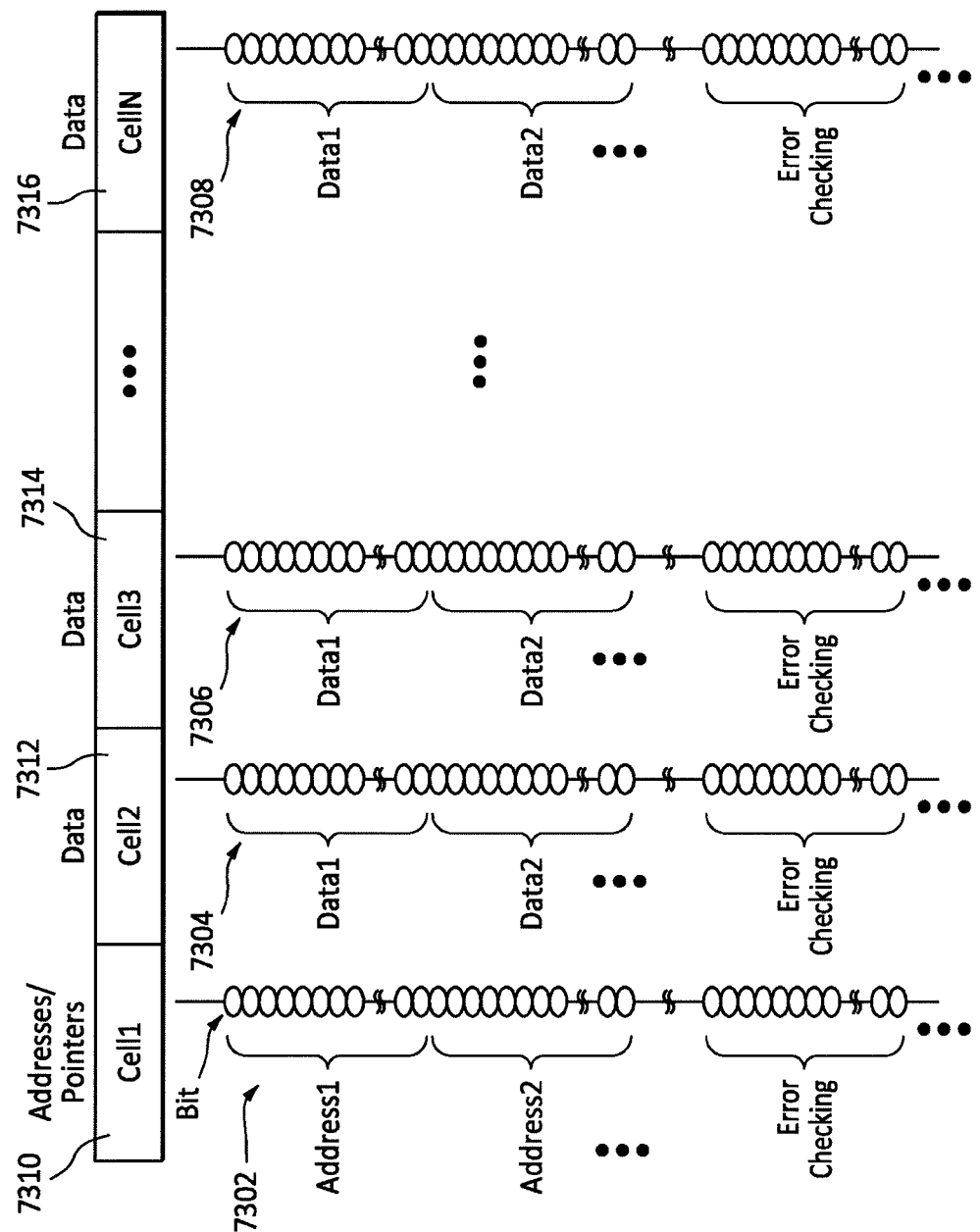
FIG. 9 shows an alternative data format listing of the bits on a memory string for each cell in a row, in accordance with embodiments of the present disclosure.

Referring to FIG. 9, in some embodiments, some cells may store only address information, and some cells only data information. In that case, each row may have a cell, e.g., Cell 1, 7310, which has a memory string 7302 of addresses or pointers, and the remainder of the rows, e.g., Cell 2-Cell N, 7310-7316, respectively, have corresponding strings of data 7304-7308, respectively. In that case, the addresses or pointers would have a value indicative of where the data is stored on the memory chip, such as a row, column and entry number, e.g. Row 3, Column 8, Entry 50, meaning the data corresponding to this address resides at the 50$^{th}$ data block on the memory string, located in Row 3 and Column 8. This effectively decouples the address from being located physically next to the data, which can provide flexibility in storage. Also, each of the strings may have one or more error checking or security components to validate the information stored on the string. This may be repeated for each row in the array.

Figure 10:
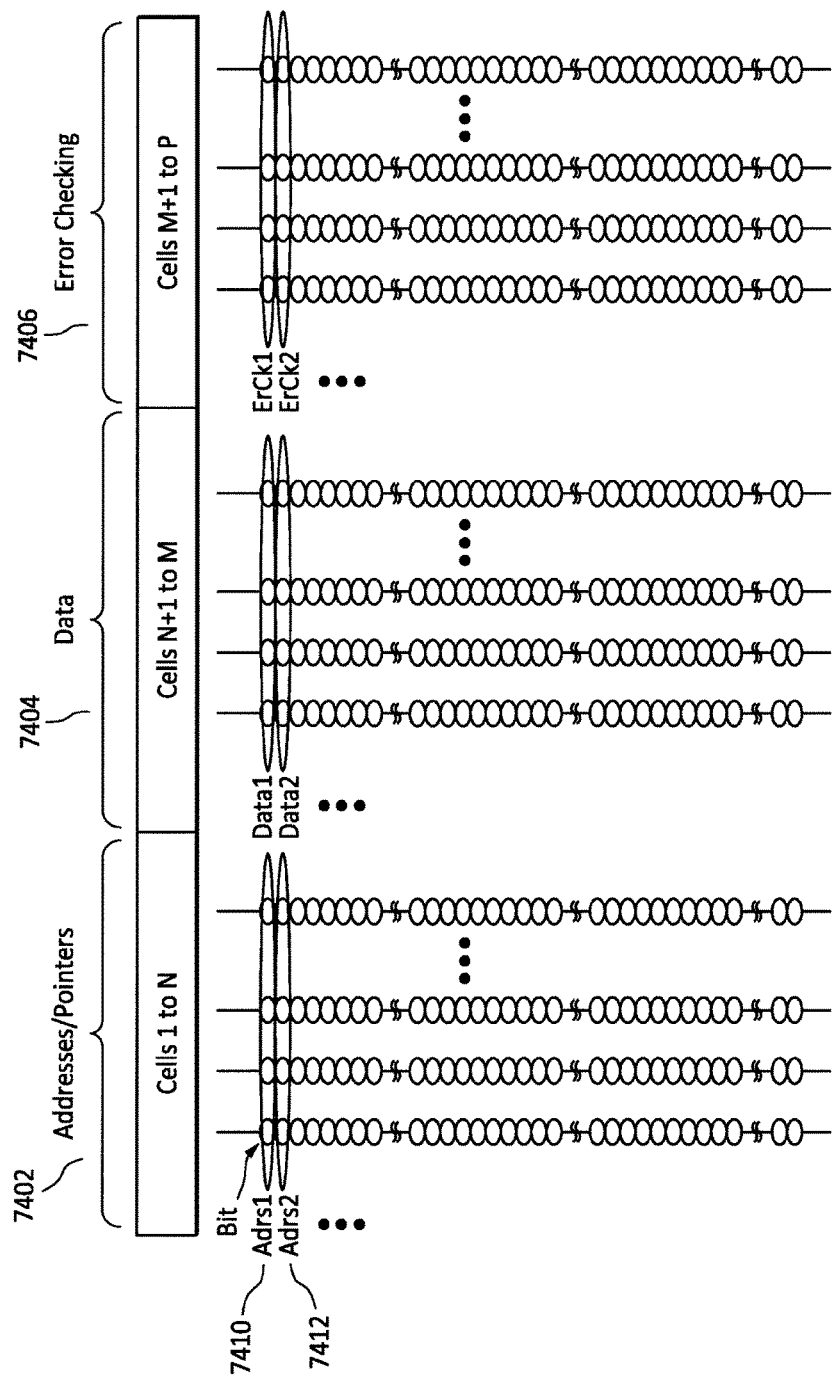
FIG. 10 shows an alternative parallel data storage format listing of the bits on a memory string for memory cells in a row, in accordance with embodiments of the present disclosure.

Referring to FIG. 10, instead of storing information contiguously (or serially) on a given memory string, the data may be stored in the memory cell array in parallel (e.g., across a plurality of memory strings). For example, when a storage word is stored, it may be able to be stored more quickly in a single storage action, storing it across the array, similar to the way traditional semiconductor memory works, but allowing it to do it over and over again due to the 3D depth, each time "pushing" (storing) another storage word in parallel onto a predetermined group of memory strings. Such a format also enables quick parallel retrieval of a given storage word (once located). In that case, certain cells 7402 may be allocated to storing addresses/pointers in parallel, certain cells 7204 may be allocated to storing data in parallel, and certain cells 7406 may be allocated to storing error checking and security data in parallel. For example, the storage word ("Address, Data, Error Checking") stored on memory string 7210 shown in FIG. 8 (which is stored in series on the one string 7210), may be stored as shown as storage word 7410, having Address1, Data1, and Error Check1, and which is stored in parallel across a plurality of cells (1–N, N+1 to M, and M+1 to P). Similarly, for storage word 7412 which would be stacked across the same strings in parallel with the storage word 7410 (either underneath or on top of, depending on the direction of storage on the string). In some embodiments, the data may be stored in parallel in 2 Dimensions (e.g., across a 2D array or matrix of rows and columns at a given layer or depth level), thereby creating a layered 2D array of stored information, such as a multi-layered 2D image capture data may be stored, except allowing a 2D image it to be stored simultaneously at one time, in realtime, with each 2D snapshot stored in the cell array in a single layer on top of the prior snap shot image in the array.

As also discussed in the aforementioned commonly-owned U.S. patent application Ser. No. 16/866,364 (the '364 Application), while DNA using two and four bits (or bases) representing data to be read have been described herein, any number of "bits" (or monomers or bases) may be used if desired for the data storage polymer (or memory string), provided the change in cell capacitance or impedance (and corresponding resonance frequency, or frequency response) is sufficient to produce an output magnitude and/or phase for each bit that is distinguishable over each of the other bits. While such capacitance (or impedance) change may be accomplished by changing the physical molecular size of the bases (e.g., the diameter), any property of the bases that creates a unique capacitance (or impedance) value of the cell when passing through the nanopore may be used if desired. For example, bases that have different dielectric properties, different ionic (or charge) properties, and/or different quantum mechanical/electrical properties, may be used, provided they meet the desired functional and performance requirements.

As also discussed in the aforementioned '364 Application, the bits may be binary bits; however, they are not limited to any base numbering system as the present disclosure allows the memory (or polymer) stick (or string or strand) to write (or add) more than two different values, as described herein. In that case, the cell design would be adjusted accordingly. For example, for a base-4 system (e.g., GCAT, for DNA based system), there would be 4 add chambers and a single de-block chamber, as described herein. This can be extended for any base number system greater than 2, such as 3,4,5, 6, 7, 8, 9, 10 (decimal), or more, up to N. Where there would be N add chambers and 1 deblock chamber. The only limitation would be that the chambers are oriented such that the memory string (or DNA or polymer) can reach all the add chambers, as discussed more herein and in the '364 Application.

As also discussed in the aforementioned commonly-owned U.S. Pat. Nos. 10,438,662 and 10,640,822, FIG. 26 in the aforementioned patents also depicts a top view showing four addition chambers which share a common reserve or deblock chamber and the polymer is tethered at a position (9) with access to each of the four chambers. The cross section (side view) of this layout would be as depicted in FIGS. 24 and 25 in the aforementioned commonly-owned patents, and the charged polymer can be moved into each of the four addition chambers by operation of the electrodes in the electrical control layer (1 in FIG. 24 in the aforementioned patents).

More specifically, referring to FIG. 11 herein, two 4 add-chamber memory cells are shown, a side view of a row of chambers, and a top view of a square geometry configuration of chambers. In both configurations. the memory string 6550 resides in a deblock (DB) chamber and can enter the four addition or "add" chambers. Each of the four add chambers has a unique chemical construct (or monomer) or code that is added to the polymer memory string 6550. This can be viewed as four (4) unique codes, which in binary would be 00, 01, 10, 11 (or 0 to 3 in decimal). The four codes could also be the four bases in DNA, i.e., GCAT, as discussed herein and in the aforementioned commonly-owned patents and patent applications. Such a configuration enables the bulk writing of information or data (multiple bit writing) with a single chamber add reaction, which increases the storage density of data and speed at which the data can be stored, over writing a single bit during each write cycle (or add reaction). This can be done for any number of unique addition chambers that provide a unique code (or chemical item or construct) in a given memory cell, the only limit is the number of unique chemical items or constructs that can be added or written to the memory string (or polymer), and that can be identified (or read), as described more herein.

Figure 12:
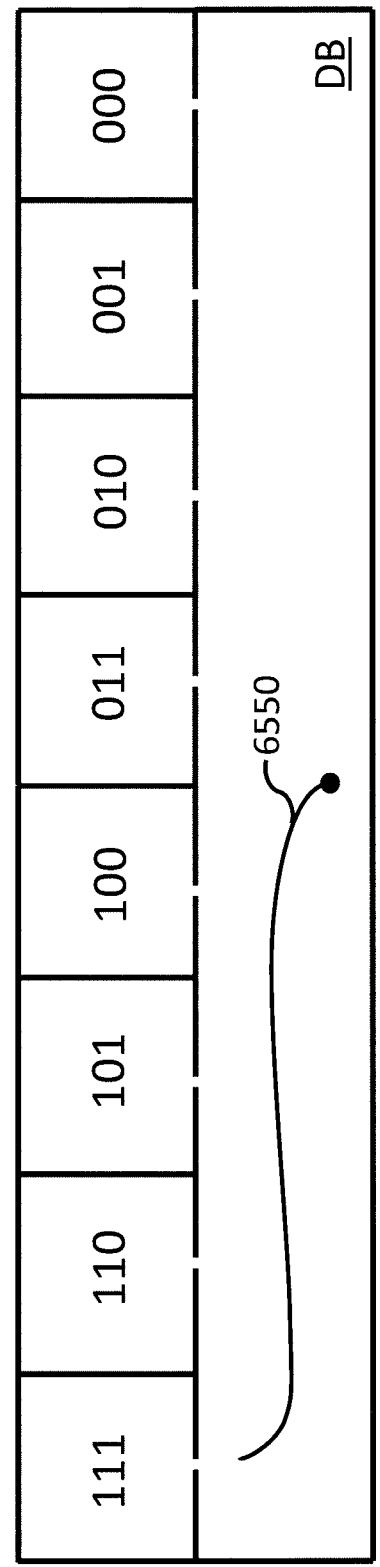
FIG. 12 shows an 8 add-chamber memory cell and corresponding three-bit binary codes, in accordance with embodiments of the present disclosure.

Referring to FIG. 12, an 8 add-chamber memory cell is shown, as a side view of a row of 8 add chambers corresponding to 8 unique chemical constructs (or monomers) that are individually added to the polymer memory string during an add reaction. This can be viewed as eight (8) unique codes, which, in binary, would be 000 to 111 (or 0 to 7 in decimal).

This concept may be extrapolated for any number of bits for a given cell, as described in the aforementioned commonly-owned U.S. patent application Ser. No. 16/866,364 (the '364 Application), where the memory cell may have a plurality of add chambers corresponding to the desired design. In particular, using multi-bit writing configurations, such as those shown in the '364 Application (or any other configurations that accomplish the same result), may be used to create an array or plurality of N-chamber memory cells to provide further enhanced data storage density. In particular, M memory cells having N add chambers per cell, allows for the creation of a Base-N storage "word" having M digits, written in parallel across memory strings for each of the cells, where the "word" would have values of 0 to (N^M)−1. Also, a single memory cell or string creates a Base-N "word" having M digits or codes along the length of the memory string (word values of 0 to (N^M)−1), written in a single memory cell or string.

In some aspects or embodiments, the present disclosure provides a method for storing data on a polymer in a nanopore-based device, comprising providing a memory cell having at least three add chambers each of the add chambers having a nanopore arranged to allow the polymer to enter and exit the add chamber and each of the add chambers arranged to add a unique code to the polymer when the polymer enters the respective add chamber, and a "deblock" chamber arranged to enable the polymer to receive the code when the polymer enters the respective add chamber; and successively steering the polymer from the "deblock" chamber through the nanopore to the add chambers to add the codes to the polymer based on a predetermined digital data pattern to create the digital data pattern on the polymer. In some embodiments of the present disclosure, the Add chambers and Deblock chamber may be "legs" of a Y nano-channel, as discussed hereinafter.

In some aspects or embodiments, the invention provides a method for storing data using a polymer, comprising: providing a nanopore polymer memory device, the device having at least one memory cell comprising at least three addition chambers, each of the addition chambers arranged to add a unique code to the polymer when the polymer enters the respective addition chamber, the data comprising a series of the codes having a number of data states corresponding to the number of unique codes; and successively steering the polymer through the nanopore into the addition chambers to add the codes to the polymer based on a predetermined digital data pattern to create the digital data pattern on the polymer.

In some embodiments, the number of unique codes for each memory cell may be any integer greater than 2. In some embodiments, the number of unique codes for each memory cell may a binary number. In some embodiments, the number of unique codes for each memory cell may be a binary number greater than 2, such as: 4, 8, 16, 32, 64, 128, 256, 512, 1024, 2048, 4096, 8192, 16384, 32768, or 65536, or higher. In some embodiments, each code may be indicative of a digit in a word, the digit having a Base-N based on the number of unique codes, and the word having a length M based on the number of digits. In some embodiments, the code is indicative of a multi-bit binary digital code.

Also, in some embodiments, each code may be indicative of a digit in a word, the digit having a Base-N based on the number of unique codes, and the word having a length M based on the number of digits. In some embodiments, the nanopore memory device of the present disclosure may include one or more memory cells in the device. Also, any technique for reading the unique codes written to the memory string (or polymer) may be used if desired.

The term "data" as used herein includes all forms of data including data representing addresses (or labels or pointers, including physical or virtual), machine code of any type (including but not limited to object code, executable code and the like), error checking, encryption, libraries, databases, stacks, and the like that may be stored in memory. In certain examples, such as is described in the aforementioned '364 Application, the term "Data" may be shown or described as being separate from the "Address," or "Error Checking". In those cases, these terms may be used to show different forms of data for illustrative purposes only.

Also, as described in the aforementioned commonly-owned U.S. Pat. No. 10,640,822 (the '822 Patent), e.g., FIGS. 82A, 82B, 82C, and FIGS. 94 and 95 of the '822 Patent, nano-channels (or "nano-paths") may be used in some instances or embodiments to guide the polymer or DNA and keep the DNA from folding on itself, knotting-up or the like. In that case, the three chamber cells such as that shown in FIGS. 1-3 herein, may be modified such that instead of having nanopores located in a membrane, there may be a fluidic nano-sized channel or tube (or nano-channel) between chambers (or in some embodiments replacing the chambers) along which the DNA (or other molecule or cells) travels or flows in fluid between an upper chamber and lower chamber.

Figure 13A:
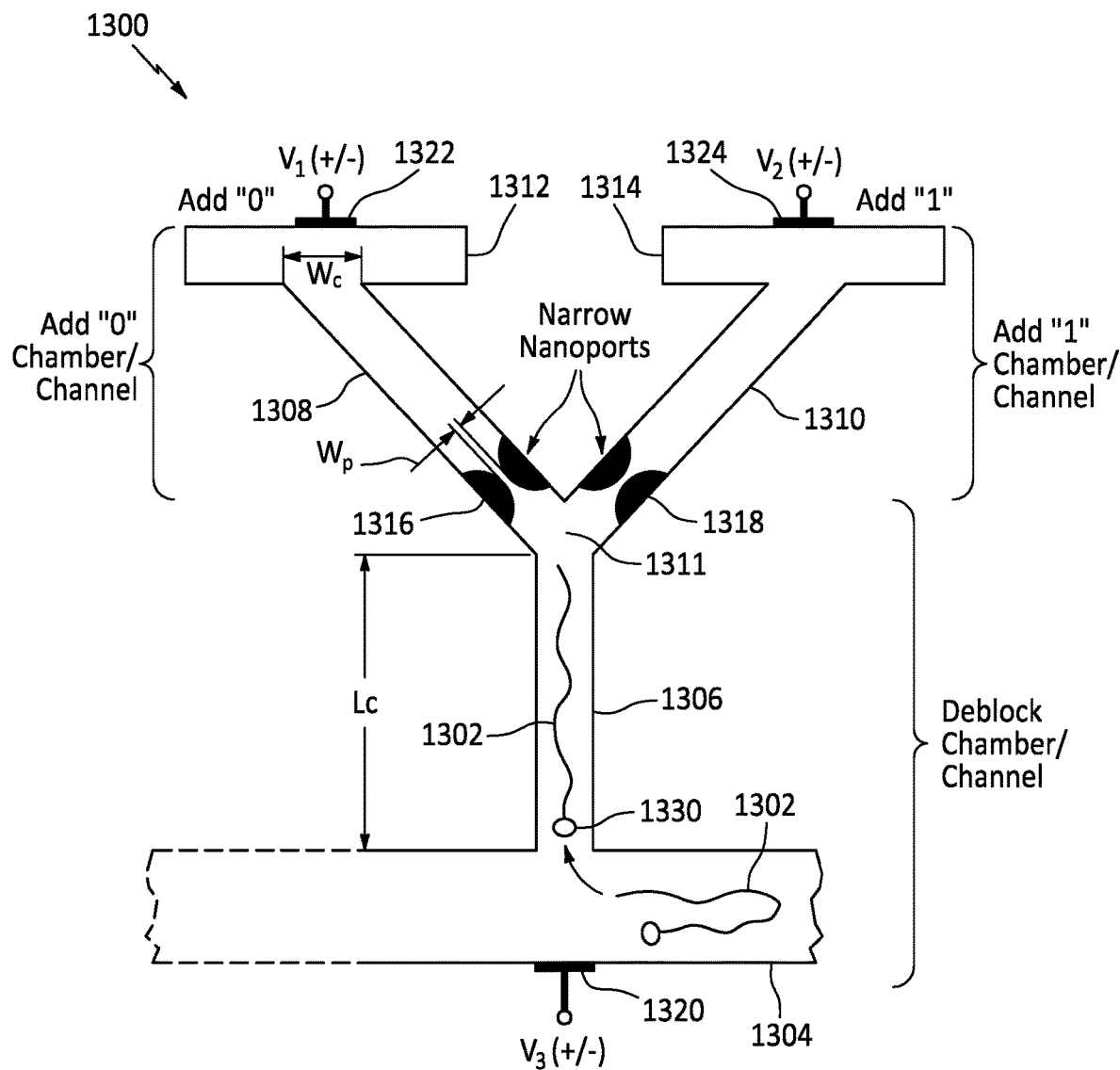
FIG. 13A shows a view of a portion of a device using a "Y" nano-channel with nano-ports to perform bit addition or synthesis, showing DNA in the "deblock" channel in accordance with embodiments of the present invention.
Figure 13B:
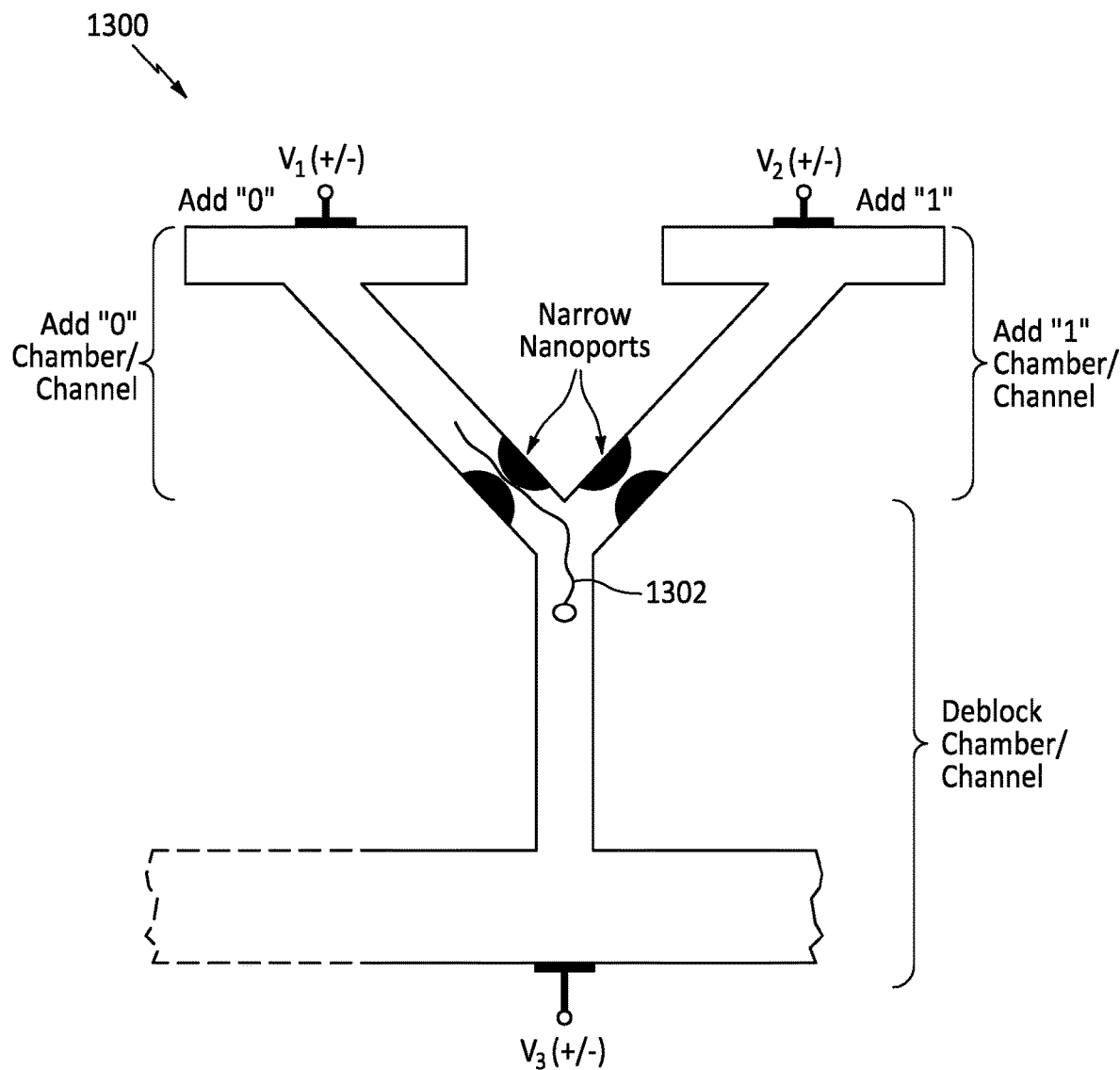
FIG. 13B shows a view of a portion of a device using a "Y" nano-channel with nano-ports to perform bit addition or synthesis, showing DNA in the Add "0" channel, in accordance with embodiments of the present invention.

Referring to FIGS. 13A and 13B herein, a "Y" nano-channel 1300 (or Y nano-channel cell) is shown having a lower "deblock" channel (or leg) 1306 fluidically connected at one end to an upper left Add "0" channel (or leg) 1308, and to an upper right Add "1" channel (or leg) 1310 at a common intersection point or hub or region 1311. The end of the deblock channel 1306 opposite to the hub point 1311 is fluidically connected to a deblock feeder channel or reservoir 1304 (or chamber), or DNA/polymer loading channel, discussed hereinafter. The end of each addition channels 1308,1310 opposite to the hub point 1311 is fluidically connected to a respective well or feeder channel or reservoir 1312,1314 (or chamber), respectively, having the appropriate fluids/liquid chemistry necessary to perform the desired bit addition function described herein and in the aforementioned commonly-owned US Patents.

In addition, the Add "0" channel 1308 and the Add "1" channel 1310 may each have a reduced-width region (or constriction or restriction) 1316,1318 having an opening width (or diameter or effective diameter) Wp that functions as a nanopore-sized gate or "nano-port" that keeps the addition enzymes and blocking enzymes (described in the aforementioned commonly-owned patents) that are larger than the nano-port opening width Wp from flowing into any other nano-channels (or legs) of the "Y" nano-channel. In some embodiments, the enzymes may be covalently bonded or otherwise attached or tethered to beads (e.g., about 50 nm to 1,000 nm diameter). In that case, the opening Wp of the nano-port constrictions 1316,1318 would be smaller than the bead size. In some embodiments, the enzymes may be bonded or attached or tethered to a surface or wall of the Add channels and Deblock channels. In that case, the nano-port constrictions 1316,1318 may not be required.

There are electrodes 1322,1324 at the top of the left Add "0" chamber or reservoir 1312, and at the top of the right Add "1" chamber (or reservoir or well or feeder channel) 1314, respectively. Also, there is a bottom electrode 1320 associated with the deblock channel 1306 and deblock chamber (or reservoir or well or feeder channel) 1304. The electrodes 1320, 1322, 1324 are used to move (or steer) the charged polymer or DNA 1302 along the Y nano-channel.

In some embodiments, the electrodes may be placed on the legs of the Y nano-channel, e.g., near the end of the leg or channel. In that case, the electrodes may be placed on any wall, floor and/or top of the channel or around the entire channel at a given location along the channel to perform the functions described herein.

In operation, a charged polymer or DNA strand (or memory strand or string) 1302 would enter the deblock nano-channel 1306 via a deblock feeder (or loading) channel 1304 (FIG. 13A). In that case, the Add "0" and Add "1" electrodes 1322, 1324 at the top of "Y" nano-channels allows the DNA strand 1302 to be pulled to the left nano-channel 1308 path to Add "0" (see FIG. 15B) and to the right nano-channel path to Add "1", and the electrode 1320 at the bottom would pull the DNA strand 1302 back into the deblock channel 1306. There may also be a bead (or DNA origami or other molecule tethered to the DNA larger than the nano-port width Wp) 1330 at the bottom end of the DNA strand 1302 which is larger than the nano-port opening width Wp and keeps the DNA strand 1302 from passing all the way through the narrow nano-port regions 1316,1318.

The nano-channels (or legs) 1306, 1308, 1310 that make up the "Y" nano-channel 1300 (FIG. 13A) may each be the same dimensions and may each have a length Lc longer than the length of a typical nanopore, e.g., about 10 nm, or longer than about 50-100 nm (or greater), and a width (between side walls) of about 10 nm to 1000 nm, and a depth or height Hc (into the page for FIG. 13A—not shown), from top of side wall to floor of nano-channel, of about 10 nm to about 1000 nm. The width Wc and height Hc may be sized to help keep the DNA from becoming tangled or knotted, similar to the nano-channel described herein before with FIGS. 82A, 82B, and 82C of the aforementioned commonly-owned '882 Patent.

The width Wc (or the effective diameter) of the nano-channels 1306,1308,1310 that make up the Y nano-channel 1300 may be set to at least partially linearize or elongate the DNA so it is not tangled or knotted or folded on itself, or the like, in the fluidic nano-channels 1306,1308, 1310, to allow the DNA to be substantially linearly flowed along same, e.g., such that only one monomer occupies a section of a nano-channel at a time, e.g., entropic confinement. For example, for double stranded DNA the width of the nano-channel may be about 40 nm, and for single stranded DNA the width Wc may be about 20 nm. Other widths may be used if desired. In some embodiments, the width Wc and height Hc may be about the same dimensions to assist in providing substantially linear flow of the DNA. There may be an upper fluidic chamber which holds the DNA (or other molecule). Other dimensions may be used if desired, provided they provide the function and performance described herein. In some embodiments, the nano-channel may have a square (or rectangular) cross-section or a circular (or oval) cross-section, respectively. Also, the nano-channel legs may be any cross-sectional shape, e.g., square, rectangular, circular, oval, polygon, or other shape or any combination of same. Also, in some embodiments, the nano-channels (or legs) 1306, 1308, 1310 may each have different dimensions if desired. In some embodiments, the nano-channel may be nano-sized tube having an outer diameter and inner diameter, within which the DNA flows. In some embodiments, the nano-channel may be a series of short nano-channels or nano-tubes arranged in series and may be separated by a predetermined spacing.

The nano-channels 1306,1308,1310 and nano-channel nano-ports or constrictions 1316,1318 used herein may be similar to nano-channels described in U.S. Pat. No. 10,676, 352 to Cao; U.S. Pat. No. 8,722,327 to Cao et al; and U.S. Pat. No. 9,725,315, to Austin et al, which are incorporated herein by reference to the extent necessary to understand the present invention. The Y nano-channel embodiments described herein may be formed by any technique that provides the functional and performance requirements described herein. In some embodiments, the nano-channels may be patterned or etched into a substrate, e.g., fused-silica or other material that provides the function and performance described herein. In some embodiments, the nano-channels may be lithographically fabricated.

The DNA (or other polymer or molecule) 1302 may have a bead (or DNA origami or other particle or molecule) 1330 attached to one end (such as the bead) that causes that portion of the DNA to be retained in the deblock channel 1306 does not pass through the nano-ports 1316,1318 in the nanochannels. In some embodiments, the bead may be magnetic or charged, such that it is attracted to the bottom electrode to ensure the DNA is pulled into the deblock nano-channel 1306.

Also, any desired technique for measuring or reading the data written (or stored) on the charged polymer or NDA strand may be used if desired. For example, in some embodiments, the longitudinal and/or transverse resonators discussed in the aforementioned commonly-owned US patents may be used if desired. In some embodiments, a DC bias current may be measured from one of the addition chambers or channels electrodes to the deblock electrode. In some embodiments, the data may be read using optical techniques such as reading a fluorescent tag for each bit written, or an optical resonance approach where an excitation light causes the emission of photons at the reading location, such as is discussed in the aforementioned patents to Cao and Austin. Any other reading technique may be used provided it provides the desired performance and accuracy. Also, the nano-ports may be a location used for reading the data on the DNA strand as the nano-ports are narrower than the main nano-channel (improving certain electrical effects, such as bias current and impedance changes) and are closer to the DNA strands. Also, the nano-ports 1316, 1318 may be located anywhere along the length of the addition channels 1308, 1310, respectively, depending on the desired function.

Figure 14:
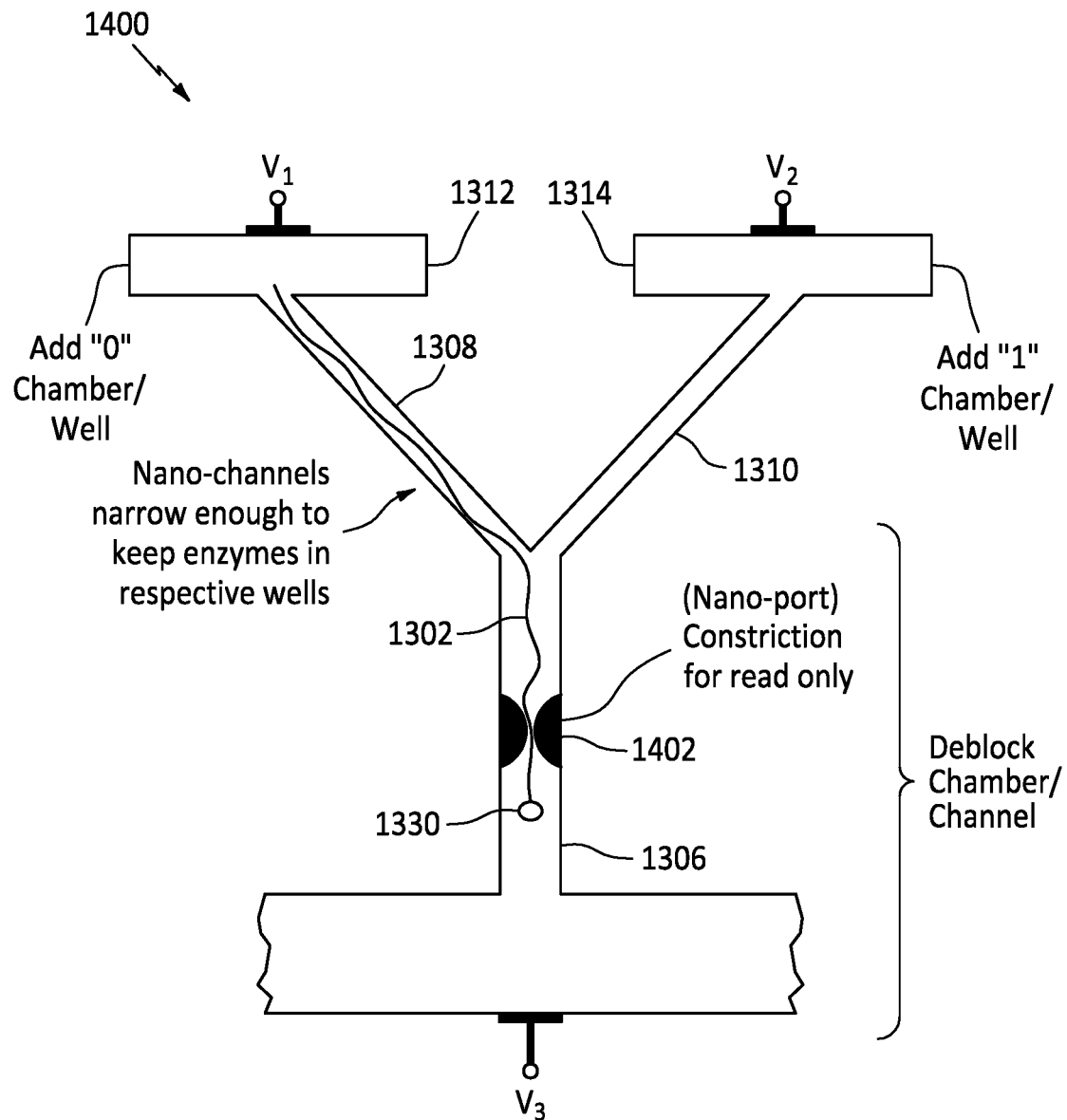
FIG. 14 shows a view of a portion of a device using a "Y" nano-channel with a nano-port in the deblock channel, in accordance with embodiments of the present invention.

Referring to FIG. 14, in some embodiments, the Y nano-channels 1308,1310 may have a width We that is narrow enough to keep the addition enzymes in their respective addition chambers 1312,1314, and a single constriction or "nano-port" 1402 may be disposed in the deblock channel 1306. In that case, the DNA 1302 would pass through the nano-port along the appropriate addition channel 1308,1310 (based on the electrode steering voltages) and into the corresponding addition chamber 1312,1314 for the addition reaction to occur, and the bead 1302 at the end of the DNA memory strand would not allow the DNA to completely pass through the nano-port constriction 1402. Also, the nano-port 1402 may be used as a location for sensing or measuring or reading the data on the DNA (as described herein).

Figure 15A:
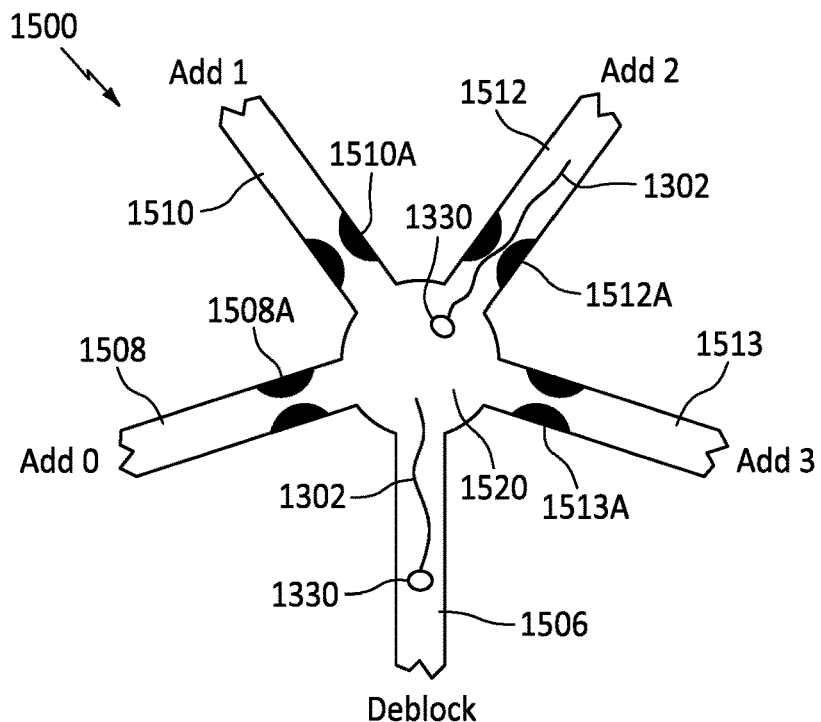
FIG. 15A shows a view of a 4-bit "star" configuration of a plurality of nano-channels with nano-ports fluidically connected at a circular hub, and showing the DNA in two different locations, in accordance with embodiments of the present invention.
Figure 15B:
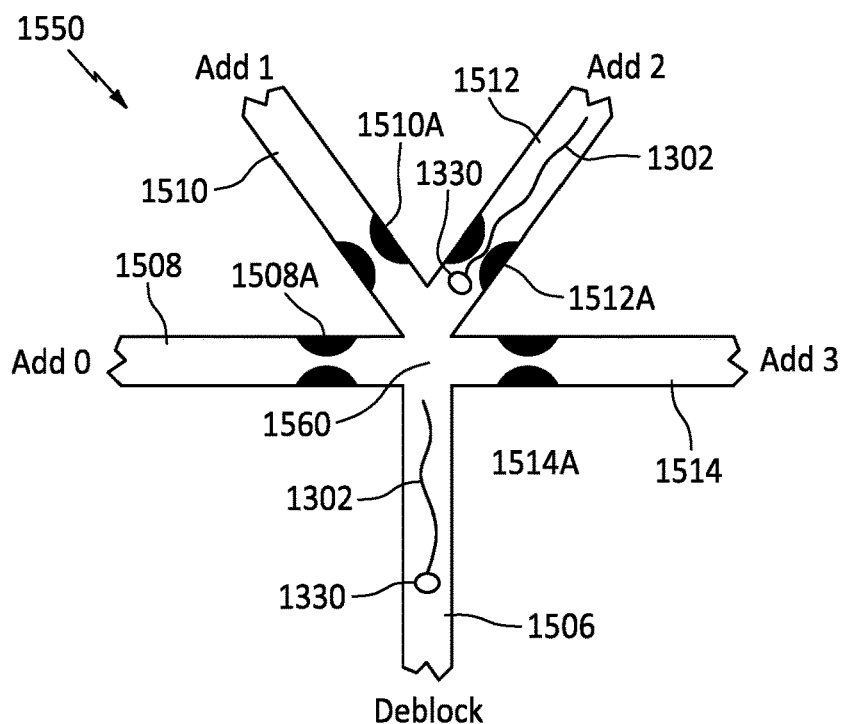
FIG. 15B shows a view of a 4-bit configuration of a plurality of nano-channels with nano-ports fluidically connected at a hub, and showing the DNA in two different locations, in accordance with embodiments of the present invention.

Referring to FIGS. 15A and 15B, two variations of a 4-bit "star" or "hub and spoke" nano-channel configuration 1500, 150, respectively, is shown. In particular, each configuration 1500, 1550 shows a "star" pattern with a deblock nano-channel 1506, which provides the DNA strand 1302 to one of four possible addition channels 1508 (Add 0), 1510 (Add 1), 1512 (Add 2), 1514 (Add 3). Each addition channel has a respective nano-port 1508A, 1510A, 1512A, 1514A, which blocks the bead end 1330 of the DNA 1302 from completely passing through the nano-port. In FIG. 15A, the nano-channels of the configuration 1500 are approximately equally spaced around a circular-shaped hub 1520. Whereas in FIG. 15B, the nano-channels of the configuration 1550 meet at an intersection point (or hub) 1560 which has sharp angles and are non-equidistant from each other; however, the add channels are substantially equidistant from each other, and the deblock channel 1506 has a different spacing (and is perpendicular to the Add 0 and Add 3 channels.

Figure 16:
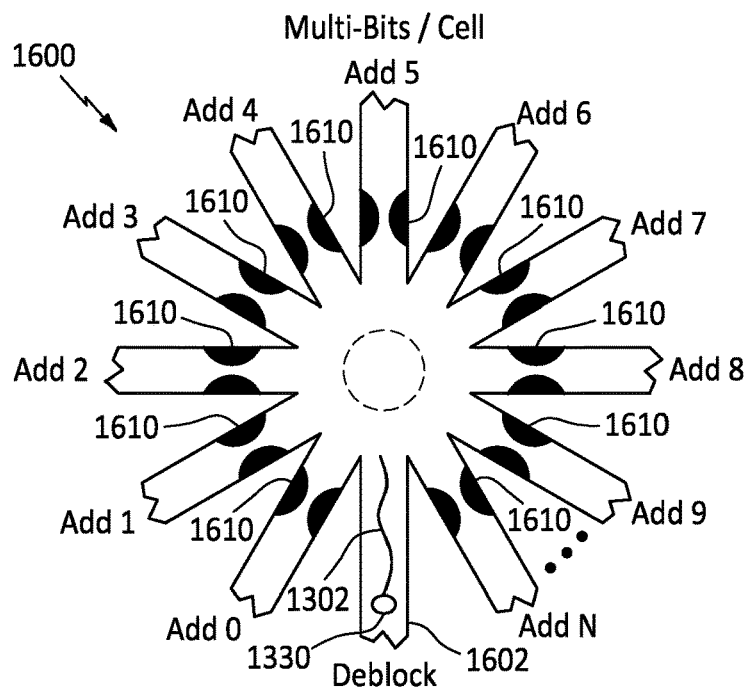
FIG. 16 shows a view of a "star" configuration of a plurality (N) of nano-channels with nano-ports fluidically connected at a circular hub, in accordance with embodiments of the present invention.

Referring to FIG. 16, an N-bit "star" or "hub and spoke" nano-channel configuration 1600 is shown. In particular, there are Add 0 to Add N arms (or spokes or addition channels) in the star or wheel and each addition channel has a respective nano-port 1610 that blocks the bead end 1330 of the DNA 1302 from passing completely through the respective nano-port. The addition channels are fluidically connected to a common deblock feeder channel or reservoir 1602. In FIG. 16 the nano-channels are shown approximately equally spaced around a circular hub 1612; however, any spacing may be used if desired.

Figure 17:
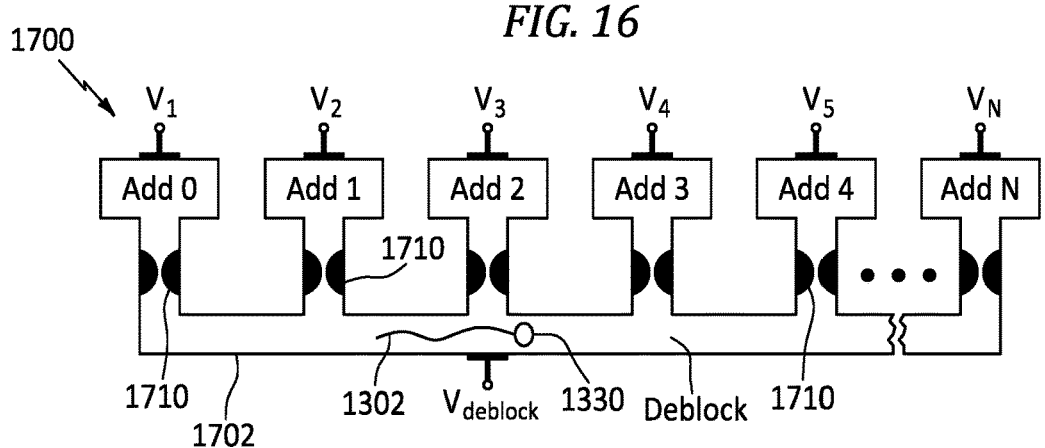
FIG. 17 shows a view of a "parallel channels" configuration of a plurality of nano-channels with nano-ports fluidically connected to a common deblock channel, in accordance with embodiments of the present invention.

Referring to FIG. 17, an N-bit parallel nano-channel configuration 1700 is shown. In particular, there are Add 0 to Add N parallel arms or "rungs" and each addition channel has a corresponding electrode and voltage applied (V1 to VN), and a respective nano-port 1710 that blocks the bead end 1330 of the DNA 1302 from passing completely through the respective nano-port 1710. The addition channels are fluidically connected to a common deblock feeder channel or reservoir 1702, having a deblock electrode connected to a deblock voltage Vdeblock. In FIG. 17, the parallel nano-channels are shown approximately equally spaced along the common deblock feeder channel or reservoir 1702; however, any spacing may be used if desired.

Figure 18:
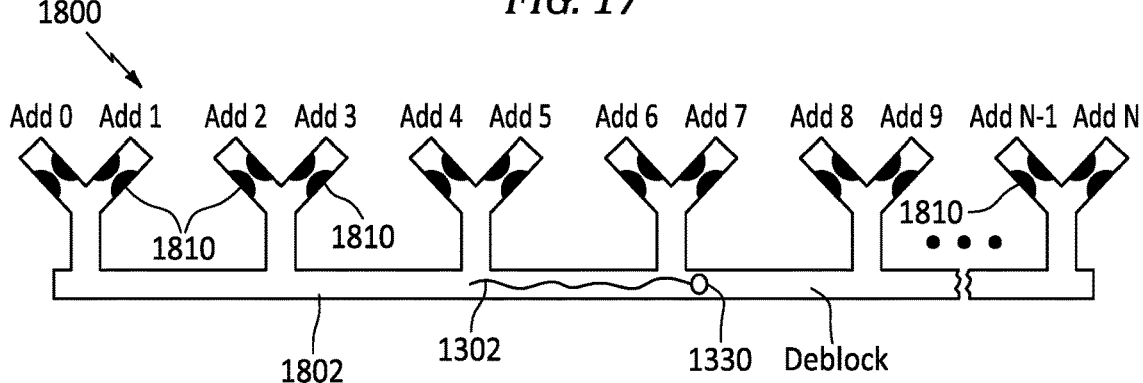
FIG. 18 shows a view of a Y nano-channel "modules" configuration of a plurality of Y nano-channels with nano-ports, fluidically connected to a common deblock channel, in accordance with embodiments of the present invention.

Referring to FIG. 18, an N-bit Y-channel parallel modules configuration 1800 is shown. In particular, there are Add 0 to Add N parallel Y nano-channel arms and each addition Y-channel has a pair of respective nano-ports (as describe above with FIGS. 13A, 13B that blocks the end of the DNA 1302 from passing completely through the respective nano-port 1810. The Y nano-channels are fluidically connected to a common deblock feeder channel or reservoir 1802. In FIG. 18, the parallel Y-nano-channels are shown approximately equally spaced along the common deblock feeder channel or reservoir 1802; however, any spacing may be used if desired.

The multiple addition channels shown in FIGS. 15A, 15B, 16, 17, 18, may be used for multi-bit storage and/or for redundancy management when an add channel fails.

In some embodiments, the Y nano-channel cell 1300 (FIG. 13A) and multi-bit variations shown herein may be one of a plurality of Y nano-channel cells or an array or network of Y nano-channels that use nano-channels to hold or guide or transport the DNA (or other molecule) being measured by the present disclosure. In that case, each Y nano-channel may have its own set of steering electrodes to move or steer the DNA strand 1302, and may be configured in the form of an array or network, discussed more hereinafter with FIGS. 19, 20, 21, 22, 21A, 22A.

Figure 19:
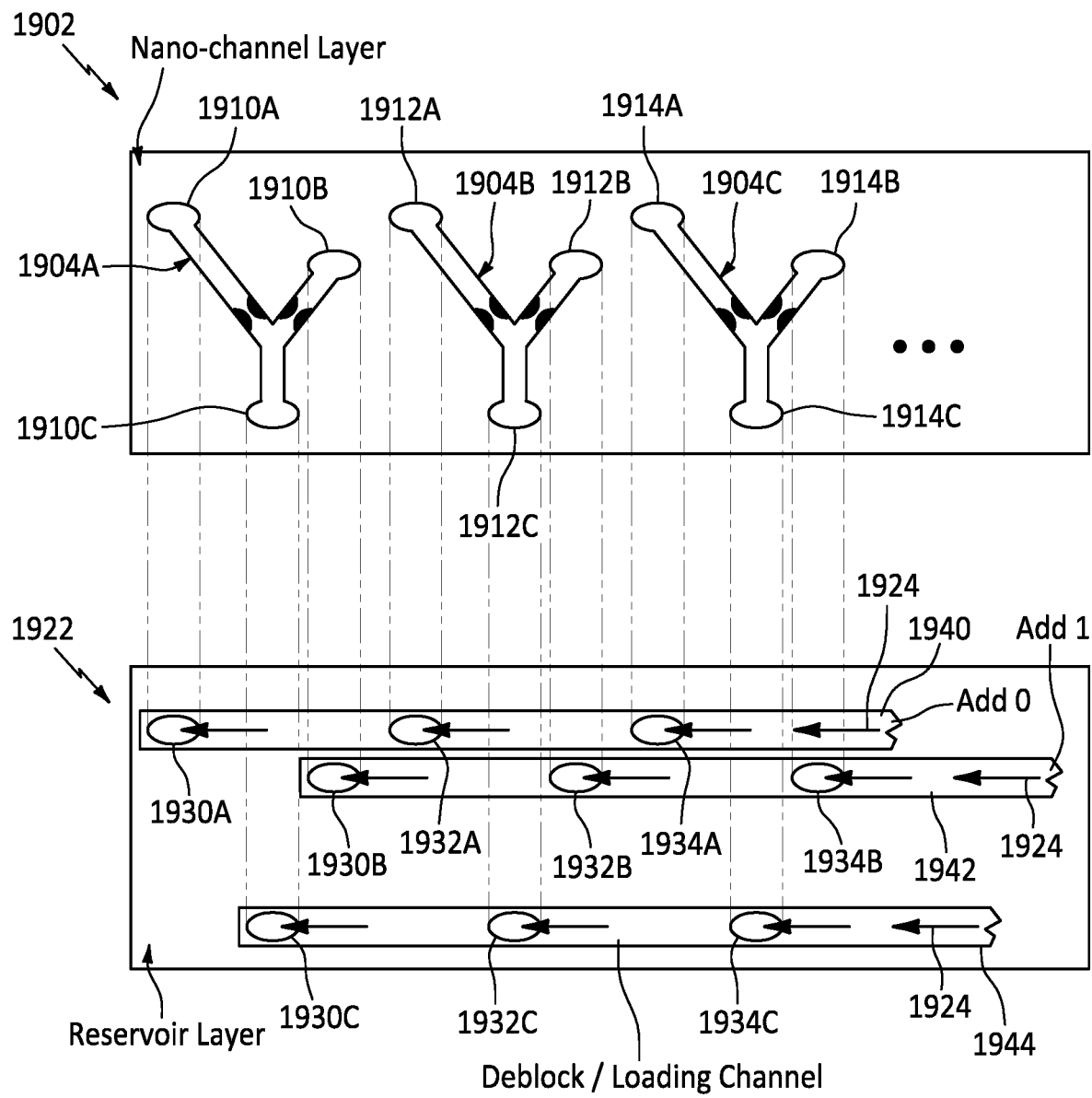
FIG. 19 shows a top view of a Y nano-channel based chip having a nano-channels fluidics layer, which fluidically connects to a reservoir layer, in accordance with embodiments of the present invention.

Referring to FIG. 19, a top expanded or exploded view showing two layers of a Y-nano-channel based memory chip is shown. In particular, there may be a nano-channel layer 1902 and a reservoir layer 1922, which may be assembled or combined as shown with the dashed lines to create the memory chip. In this case, the nano-channel layer 1902 has a plurality or array of the Y nano-channels 1300, and is fluidically connected to a reservoir layer 1922, which may be located on top of the nano-channel layer 1902. In particular, the Y-nano-channel cells 1904A, 1904B, 1904C comprises the Y nano-channels 1300 as discussed hereinbefore with FIG. 13A-13B, having circular feeder ports 1910A, 1910B, 1910C (for Y-channel 1904A) at the non-hub end of each Y nano-channel leg. Also, the Reservoir layer 1922 has feeder channels or reservoirs or wells 1940 for Add "0", 1942 for Add "1", and 1944 for "deblock" (which may also be used for DNA/polymer loading as discussed herein), and there are holes or vias through the reservoir layer that fluidically connect the respective reservoirs (or feeder channels, or loading channels) to the respective circular end ports of the Y nano-channels when assembled. Such a chip design enables the chip to have high precision nano-scale channels on one layer (Nano-Channel layer 1902), and allows the reservoir layer to be larger and looser tolerance (micron scale or larger), and thus making the chip easier to manufacture/fabricate and assemble.

Source or loading fluids for the Addition channels and Deblock channel for each Y nano-channel cell may flow as shown by arrows 1924 along each of the feeder channels 1940, 1942, 1944, from a source off the chip (not shown) along the respective channels to the holes that feed the Y nano-channels end ports described above. In some embodiments, there may be a lower reservoir layer (not shown) that receives the fluid after passing by the Y channels and providing fluid thereto, and may guide the fluid off the chip from the add channels and deblock channels (e.g., back to the source or to a waste container or other destination). In some embodiments, the loading fluid may enter from one side (e.g., the right side) and flow along the loading channel 1944 flow through the holes 1930C, 1932C, 1934C into the respective Y nano-channel cells through the ports 1910C, 1912C, 1914C, respectively, on the nano-channel layer 1902 and exit from the other of the chip. (e.g., the bottom side), and there may be the necessary fluids supply lines needed to supply the desired fluid at the appropriate times to achieve the desired loading conditions.

In some embodiments, the chip may be preloaded or prepopulated with a starter DNA/polymer memory string prior to chip assembly or may be loaded as part of the chip assembly or manufacturing process or may be loaded after assembly. The DNA/polymer memory strand or string may be loaded into the Y nano-channel cells the chip in ways similar to that described in the aforementioned commonly-owned U.S. patent application Ser. No. 16/866,364 (the '364 Application).

For example, in some embodiments, the loading channel may be a single fluidic channel (not separate channels or rows), which is fluidically connected to each of the deblock channel through the loading ports 1910C, 1912C, 1914C in the bottom of the Y nano-channel memory cells in the nano-channel cell array 1902. The loading ports 1910C, 1912C, 1914C may be similar to the loading holes described in the '364 Application. In particular, each of the loading ports, may be a micro-sized hole (or "micro-hole") having a diameter of about 0.2 microns, in the bottom of each of the deprotect/deblock legs of the Y nano-channel memory cells in the nano-channel cell array 1902 to allow the initial strand of DNA (or polymer) to be inserted into the deblock channel. The micro-hole may be large enough to also allow the DNA origami or bead (at one end of the DNA starter strand) to pass through the hole and then may be plugged after entry. Other sizes or diameters for the loading ports or holes may be used if desired provided it provides the desired function and performance.

In some embodiments, the origami or beads attached to the starter DNA strand may be large enough to plug the bottom deblock chamber loading hole, thereby providing both a tether (or attachment point) for the DNA and a plug to retain the liquid in the deblock channel similar to that described in the aforementioned commonly-owned '364 Application. In some embodiments, the large beads may be magnetic, such that the large beads will fill (or plug) the loading holes in the presence of a magnetic field in an upward direction. The magnetic beads may also be used to remove the DNA memory strings from the holes after writing by the chip is complete, in the presence of a magnetic field in a downward direction, where the beads and the attached DNA memory strands or stings may be flowed away from the chip for separate storage, similar to that described in the '364 Application. In that case, the nano-ports (constrictions) in the addition legs of the Y nano-channel cell may be used to block the addition enzymes and deblocking enzymes.

In some embodiments (FIG. 19A), the DNA loading channels may be fluidic channels or rows (fluidically isolated from each other, but fluidically connected to the cells in that row). The loading channels receive a loading fluid (or solution) containing an appropriate concentration of initial or starter DNA (or polymer) strings or strands (or memory strings) and any corresponding origami or beads that may be attached thereto, that are added to when the memory cells store (or write) data onto the DNA (or polymer) memory strings. The DNA loading fluid has a concentration of DNA (or polymer) memory strings sufficient to load all the operational memory cells along that row with at least one starting DNA (or polymer) strand, and have sufficient additional strands as needed in the solution to provide the desired function and performance described herein.

In the case of a single common DNA loading channel 1944, the loading fluid may be provided by a single fluid feed (fluid in) line and a single fluid exit (fluid out) line, and there would be a single common loading electrode for all the Y nano-channel cells in the array. In that case, all cells in the array would be affected by changes in the loading fluid and by changes in voltage applied to the common loading electrode.

In some embodiments, there may be a plurality of nano-channel layers 1922 in a given memory chip each of the nano-channel layers 1922 having an array of Y nano-channel cells. In that case, the Y nano-channel cells may form stacks of Y nano-channel cells that are fluidically connected at their end ports of the Y nano-channels. For example, if there were 5 nano-channel layers 1902, the Y nano-channel cells would form stacks of 5 cells for each position along the nano-channel cell array. In particular, the first (from the left side) Y nano-channel cells stack would be fluidically connected through the Y nano-channel cell end ports 1910A, 1910B, 1910C. Similarly, the second (from the left side) Y nano-channel cells stack would be fluidically connected through the end ports 1912A, 1912B, 1912C.

In some embodiments, some or all of the loading channels 1940, 1942, 1944 and/or the reservoir layer 1922 itself may be part of a fixture and/or fluidics instrument that is separate from the chip, and the chip may be placed in the fixture during manufacturing to pre-load the DNA/Polymer memory strings or strands with attached beads or origami, and/or to pre-load addition enzymes, or fluids having other needed molecules, into the chip. In that case, the nano-channel layer 1902 or plurality of layers 1902, in the case of a "stack" of nano-channel layers, may be placed into the fixture for loading the needed fluids and starter DNA into the Y nano-channel cells in the chip.

In the case of the loading channels or reservoir layers being part of a temporary detachable fixture, the fixture may have the necessary fluidic connections and interfaces to provide the DNA loading fluid to the loading chambers and to remove or flush-out the loading fluid (e.g., with a DNA/polymer-free buffer solution) from the loading chambers as needed. When used as a detachable fixture, when the memory cell array is removed from the DNA loading channel fixture, the bottom (or ends) of the legs of the array of Y nano-channel cells may be sealed, e.g., by a silicone coating or other coating or adhesive cover or other cover to plug or seal the loading holes to prevent leakage or drying out of the fluid in the deblock chamber. In some embodiments, the bottom loading ports (or holes) cover may be removable to allow extraction of the memory strings from the cell via the loading holes for storage of the memory strings in another storage container and/or another storage fluid/solution.

In some embodiments, micro-fluidic valves may be used in the loading channels 1944 (FIG. 19) or 1950,1952,1954 (FIG. 19A) to prevent more than one DNA memory strings from entering a given Y nano-channel cells, and/or to prevent DNA strings from moving between Y nano-channel cells when there is a common loading channel 1944 that feeds multiple Y nano-channel memory cells.

Figure 19A:
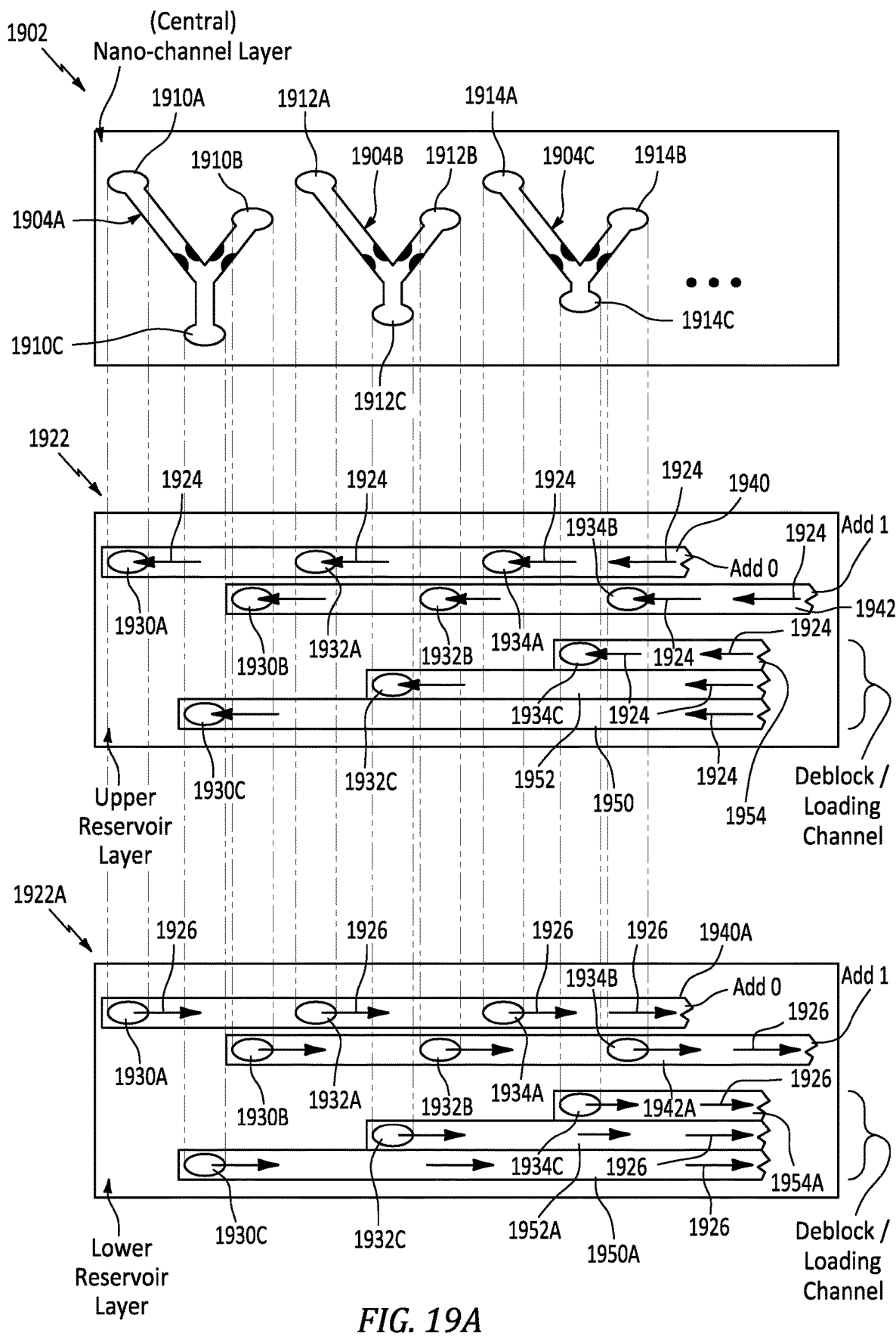
FIG. 19A shows a top view of a Y nano-channel based chip of FIG. 19 having separate deblock/load channels in the reservoir layer, in accordance with embodiments of the present invention.

Referring to FIG. 19A, a top expanded or exploded view showing three layers of a Y-nano-channel based memory chip is shown. This is similar to the chip of FIG. 19, except there are separate fluidically isolated deblock/loading channels for each Y nano-channel (or group of Y nano-channel cells). In particular, the reservoir layer 1922 of FIG. 19 may be an upper reservoir layer having fluidically isolated DNA loading rows 1950, 1952, 1954 that load the Y nano-channels through the holes (or vias) 1930C, 1932C, 1934C, respectively.

The starter DNA (or polymer) and any accompanying origami or bead attached thereto may be loaded by any process that causes the DNA to migrate into the deblock channel of the Y nano-channel, similar to that described in the aforementioned commonly-owned '364 Application. For example, the starter DNA (or polymer) and any accompanying origami or bead attached thereto may be loaded using electric field forces (active loading), or using fluidic ionic salt gradients between deblock and loading chambers (passive loading), or by a combination of active and passive loading, or any other techniques.

Figure 20:
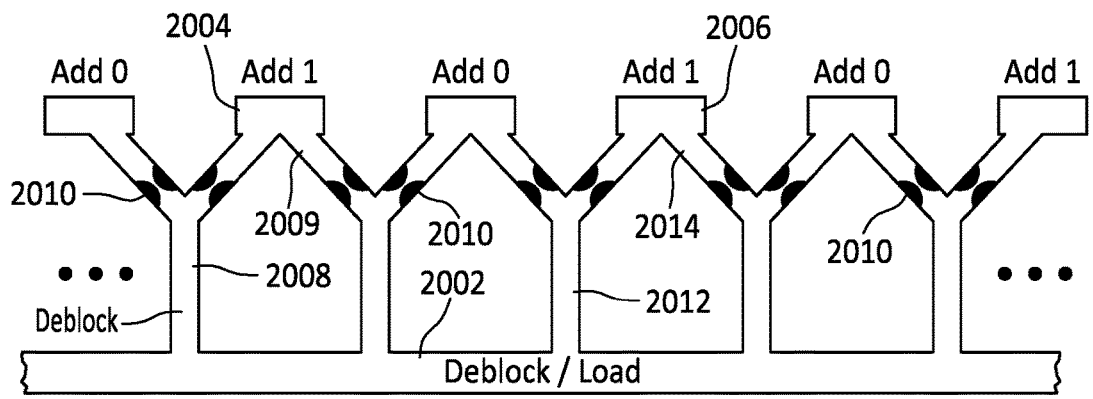
FIG. 20 shows an array of Y nano-channels having a common deblock channel and connected adjacent common Add channels, in accordance with embodiments of the present invention.

Referring to FIG. 20, an array of the Y nano-channels 1300 of FIG. 13A is shown, having a common deblock channel or reservoir 2002 connected to the deblock channels of each of the Y nano-channel cells, each of the Add channels has a nano-port 2010 as discussed herein before. In this case, the adjacent Add channels that are adding the same bit type (e.g., Add 0 or Add 1) are fluidically connected to each other and fed by the common Add channel or reservoir, in accordance with embodiments of the present invention. In particular, the Add 1 channels 2008,2009 are fluidically connected by a common Add 1 channel 2004. Similarly, the Add 1 channels 2012,2014 are fluidically connected by a common Add 1 channel 2006. In some embodiments, the common Add 1 channels 2004, 2006 may also be fluidically connected to feed all the Add 1 channels. A similar arrangement exists for the Add 0 channels.

Figure 21:
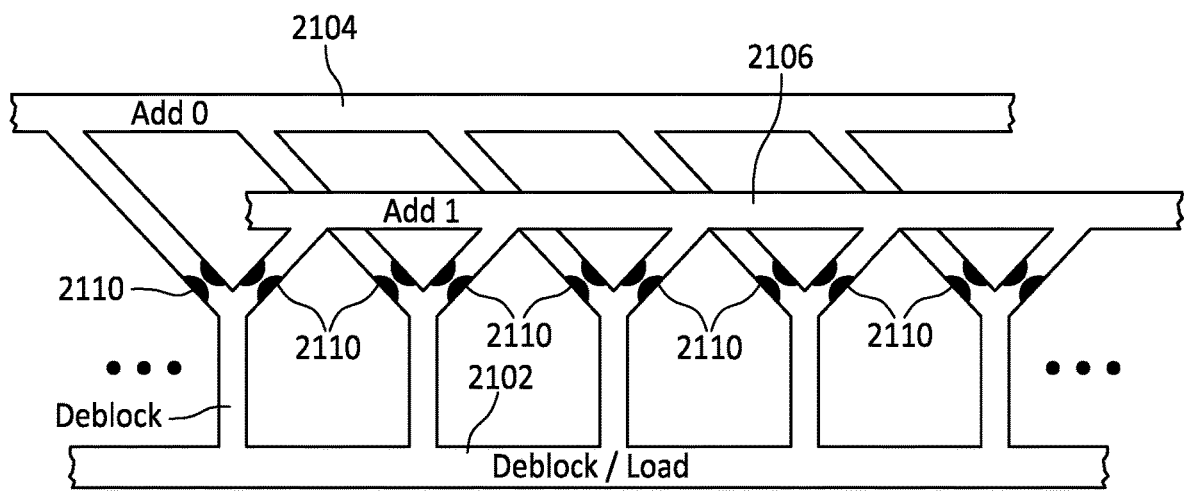
FIG. 21 shows an array of Y nano-channels having a common deblock channel and connected alternating common Add channels, in accordance with embodiments of the present invention.

Referring to FIG. 21, an array of Y nano-channels having a common deblock channel or reservoir 2102 is shown connected to the deblock channels of each of the Y nano-channel cells, each of the Add channels has a nano-port 2110 as discussed herein before. In this case, where Add channels are adding the same bit type (e.g., Add 1 or Add 0) from different Y nano-channel cells are fluidically connected to each other and fed by a common Add channel or reservoir 2104, 2106 for Add 0 and Add 1, respectively, in accordance with embodiments of the present invention. In particular, all the Add 0 channels from the different Y nano-channel cells are fluidically connected to a common Add 0 channel 2104. Similarly, all the Add 1 channels from the different Y nano-channel cells are fluidically connected together to a common Add 1 channel 2106.

In some embodiments, instead of using a nano-port within the Y nano-channel cell, the nano-channel leg dimensions (Wc) are made narrow or small enough such that the bead end of the DNA remain in the main feeder deblock channel and the addition enzymes remain in their respective chambers or reservoirs. In that case, the starting length of the DNA would need to be long enough such that the addition-end of the DNA would be able to reach into the respective addition chambers to add the desired bit (e.g., Add 0 or Add 1).

Figure 22:
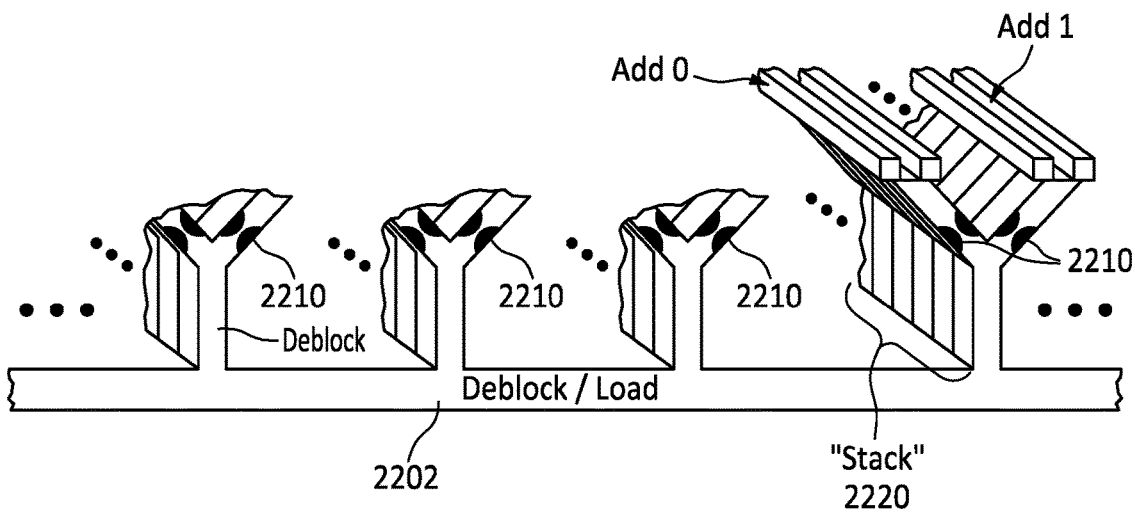
FIG. 22 shows an array of stacked Y nano-channels having a common deblock channel and connected adjacent common Add channels in each stack, in accordance with embodiments of the present invention.
Figure 23A:
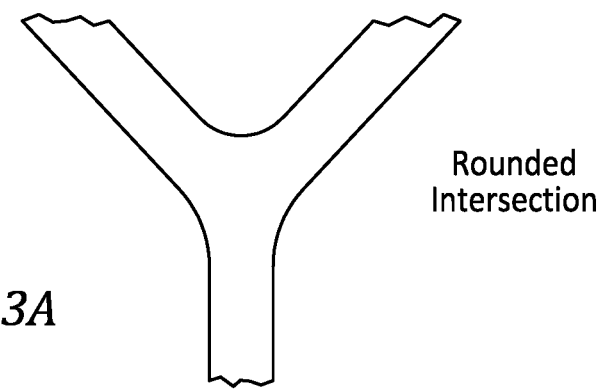
FIGS. 23A, 23B, 23C, and 23D show various alternative shapes for a Y nano-channels cell, in accordance with embodiments of the present invention.
Figure 23B:
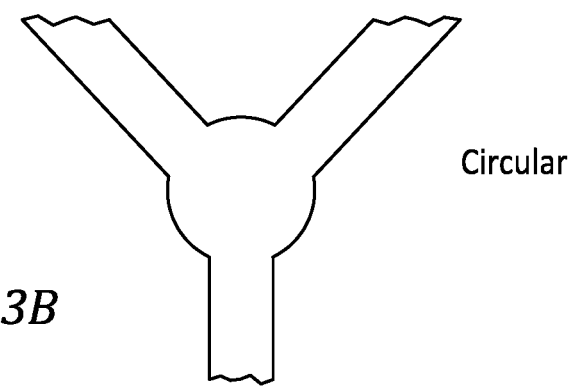
Figure 23C:
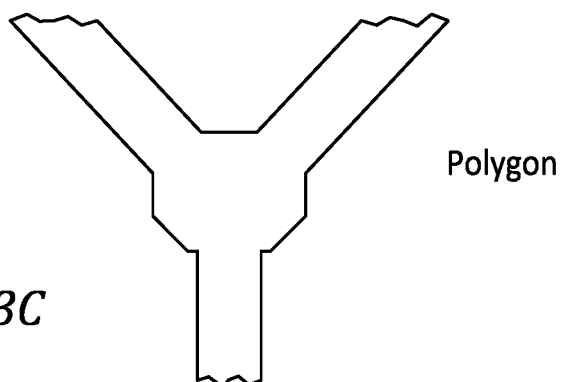
Figure 23D:
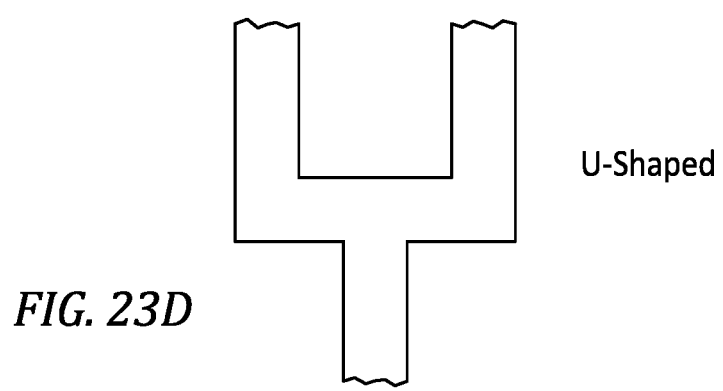

Referring to FIG. 22, an array of "stacked" Y-nano-channel cells, with each Y nano-channel cell having nano-ports 2210 (as described herein), is shown having a common deblock channel 2202 and connected adjacent common Add channels in each stack, in accordance with embodiments of the present invention. In particular, a plurality of Y nano-channel cells are "stacked" behind each other and the Add 0's are connected together, the Add 1's are connected together, and the deblock channels are connected together. All deblock channels from each stack are fluidically connected to a common deblock channel or reservoir 2202. Similarly, all the Add 1 channels from each stack and Add 0 channels from each stack may be fluidically connected to a common Add 1 channel and to a common Add 0 channel, respectively (not shown).

In the case of "stacked" nano-channel fluidics layers in the memory chip shown in FIGS. 19 and 19A, the "stack" of nano-channel fluidics layers 1902 may be similar to that show in FIG. 22, except that the common Add channels shown may be loading ports or holes that are fluidically connected together between layers of the chip.

FIGS. 20A, 21A, 22A are similar to FIGS. 20, 21, 22, respectively, except there are separate deblock channels each feeding a given deblock channel leg of a Y nano-channel memory cell (or group or stack of Y nano-channel cells).

Referring to FIGS. 23A-23D, in some embodiments, the shape of the Y nano-channel memory cell may be any type of "Y" shape (or Y-like shape), and may be any shape that provides three legs that are connected at a common central hub at one end of each leg (three leg nano-channel cell), collectively referred to herein as a Y nano-channel cell. For example, the shape of the hub or point of intersection of the three legs may be a circle, square, rectangle, oval, T-shaped, U-shaped, V-shaped, Y-shaped, polygon or a combination of same or any other shape or geometry, provided it provides the function and performance described herein. Also, the angles, positions, symmetry, asymmetry, shape and separation of the three legs of the Y nano-channel may be any desired to meet the desired function and performance requirements. Also, each of the legs of the Y nano-channel cell may have different lengths if desired and may each be any length needed to meet the desired function and performance requirements.

The technique for loading starter DNA into chip may be similar to that described in the aforementioned commonly owned '364 Application, using active and/or passive DAN loading. When a "stack" of nano-channel layers 1902 is used, this may form a matrix having rows and columns of cells, which may be similar to the rows and columns of the aforementioned commonly owned '364 Application where the rows and columns can be defined by the electrode connections and the channel fluid flows.

In some embodiments, one technique using active electric field forces (active loading) is shown below for loading a single cell at a time using the matrix array of Y nano-channel memory cells shown in FIGS. 19, 19A:

1) Load DNA (or polymer) loading fluid into all of the DNA loading channel rows 1944 (or at least the row of deblock channels being loaded);
2) Apply a positive voltage to the first Add "1" channel (or column) and a negative voltage to the first row of the DNA loading channel;
3) Simultaneously with step (2), apply a voltage more negative than that applied to the first row of the DNA loading chambers to all other Add "1" and Add "0" channels (or columns) and apply a positive voltage greater than that applied to the first Add "1" channel (or column) to all other loading row electrodes (to keep the DNA in other rows and columns from migrating into any of the un-addressed cells in those rows/columns);
4) When DNA is measured through the nanopore in the Add "1" channel of the cell in Row1/Column1, change all applied voltages to 0 volts (turn off applied voltages);
5) Repeat steps (1) to (4) for each of the Add "1" channels (or columns) for the number of deblock chambers in the loading channel row;

6) Repeat steps (1) to (5) for each of the rows of DNA loading row chambers until all cells are loaded.

Optionally, for any process used to load the memory cells in the array, when the loading channels have fluidically isolated rows (as shown in FIG. 19A), when all the cells (deblock channels) in a given row are loaded, the loading fluid may be removed (i.e., fluidically rinsed) from that loading channel row and replaced with a DNA-free buffer (or left dry) to reduce the risk of stray DNA capture or loaded DNA exit. In some embodiments, after the loading fluid is removed, the deblock channels may be sealed or plugged or blocked or closed (to prevent the DNA from moving between Y nano-channel cells or for other reasons) by flowing sealing fluid through the loading channel 1944.

Also, for any of loading process using the memory cells described herein, the deblock electrode on the bottom of the deblock channel may remain an open circuit or may be grounded or may be used with an active applied voltage provided it facilitates the migration of the starter DNA into the deblock channels.

Instead of loading each cell individually, the cells may be loaded in groups, e.g., one loading channel row at a time or one Add channel at a time. In that case, a common electrode for the row/column would remain active for DNA translocation through the nanopore, and the non-common electrodes for the opposite column/row would be deactivated (turned "off") when a DNA translocation is detected for that cell, such as is described in the aforementioned commonly owned '364 Application.

Instead of active electric field-based loading, the starter DNA (or polymer) and origami or bead may be loaded into the memory cells using a passive loading approach such as an ionic diffusion process, which uses fluidic ionic salt gradients between deblock and loading chambers to cause the DNA to migrate over time into the deblock chambers. In that case, the deblock chamber would be provided with a fluid that has a higher ionic concentration than the ionic concentration of the loading fluid. Over time, the ions in the deblock chamber will migrate into the lower concentration loading fluid, thereby causing the negatively charged DNA (or polymer) to migrate into the deblock chamber. This approach may also be coupled with an applied temperature or pressure variation of the cell and/or the loading chambers or loading fluids if desired, which may also be used alone without coupling with the above (ionic/salt) approach or in combination with any other approach (active or passive).

Instead of addressing and loading each cell individually (one at a time), the cells may be loaded by a "bulk" or "batch" or "shotgun" active loading approach where a positive voltage is applied to all the add electrodes simultaneously, or only the Add "1" electrodes and apply a negative voltage to the Add "0" electrodes, and apply a negative voltage to the loading chamber electrode(s), for a predetermined period of time, e.g., 3 second, or until one (or a predetermined number) of the nanopores in the Add channels of any memory cell registers DNA translocation or passage through the nanopore, and then turned all electrode voltages off or to 0 volts. In that case, a negative voltage may be applied to the loading electrodes for the same predetermined period of time, and then turned off to 0 volts. The predetermined time may be determined by modelling the memory cell and loading chamber(s) and fluid and DNA concentrations and determining a statistical average active diffusion time for DNA to enter the deblock chamber (or get close to the loading hole(s) or micro-holes) and/or measured empirically by measuring the average diffusion time, in the presence of an electric field caused by voltage applied to the electrodes. For example, it may be determined that after 3 seconds for a given applied voltage difference across the memory cell, a given fluid in the Add chambers and loading chambers, and a given concentration of DNA (or polymers) in the loading fluid, that about 75% of the memory cells are loaded with a single starter DNA string, 10% of the cells have two or more DNA strings, and 15% of the cells have no DNA strings. In that case, the speed of loading may be worth having 10% bad cells and the ability to selectively load the remaining 15% of the cells.

In some embodiments, the cells may be loaded by a "bulk" or "batch" or "shotgun" passive loading approach using diffusion over time where no voltage is applied to any electrodes (e.g., turned all electrode voltages off or to 0 volts), and the system is observed for a predetermined period of time, e.g., 3 second, or until one of the nanopores in the Add channels of any memory cell registers DNA translocation or passage through the nanopore. The predetermined time may be determined by modelling the memory cell and loading chamber(s) and fluid and DNA concentrations and determining a statistical average passive diffusion time for DNA to enter the deblock chamber (or get close to the loading hole(s)) and/or measured empirically by measuring the average diffusion time, without a voltage applied to the electrodes (purely passive diffusion). In some embodiments, for purely passive loading, the loading efficiency may be modeled by a Poisson distribution, such as is described in the article: A. Basu, "*Digital Assays Part I. Partitioning Statistics and Digital PCR*", SLAS Technology 2017, Vol. 22(4) pp. 369-386, which is incorporated herein by reference to the extent necessary to understand the present disclosure. In that case, it would likely indicate that about 37% of the memory cells would load with a single DNA strand, about 37% of memory cells would have no DNA strands, and the remaining percentage of memory cells (about 26%) would have more than two strands.

In some cases, passive diffusion may cause the DNA to move close to the loading hole(s) of the deblock channel, but additional forces may be required to help it enter the channel through the loading hole(s), such as using and electric field (i.e., electrophoretic), or a salt gradient (discussed above), or a pressure difference, or a temperature difference or temperature cycling or another approach. In particular, a pressure (or pneumatic) difference and/or a temperature difference or temperature cycling may be used to provide additional forces to act on the DNA strands for it to enter the chamber/memory cell.

In some embodiments, a combination of both active and passive (hybrid) loading (for batch or individual cell or row/column-based or other loading) may also be used if desired. In that case, a voltage may be applied to get the DNA moving, but then shut off before any translocation occurs (or when only a few translocations have occurred), and allow passive diffusion to fill the remaining cells. Any other combination of active and passive loading may be used if desired to load the starter DNA strands into the memory cells.

For any of the above batch loading approaches, after the predetermined time, the loading chamber(s) may be rinsed to remove DNA from the fluid in the loading chamber, and the memory cells tested using active steering voltages applied to the Add channels electrodes and the Deblock electrode to determine which memory cells have one starter DNA string, which cells more than one starter DNA string, and which cells are empty. Once that is determined, loading fluid may be re-introduced to the loading chamber(s) and the empty cells may be loaded individually (or as a group) as discussed hereinabove, while not disturbing the properly loaded cells. The memory cells identified as having more than one DNA (polymer) string may be deemed inoperable and not used for memory storage, similar to a bad sector or region of conventional memory devices or chips.

In addition, the deblock channel may be viewed like an "entropic capture chamber", such as that discussed in the article: Liu, et al., "Entropic cages for trapping DNA near a nanopore", Nature Communications, Feb. 4, 2015, which is incorporated herein by reference to the extent necessary to understand the present disclosure. In that case, the starter DNA (polymer) strands may enter the deblock channel from the loading channel using the approach or process discussed therein.

Any other loading processes may be used to load the starter DNA string and any accompanying origami or bead into the deblock chamber of the present disclosure provided it provides the desired function and performance requirements.

The system, computers, servers, devices and the like described herein have the necessary electronics, computer processing power, interfaces, memory, hardware, software, firmware, logic/state machines, databases, microprocessors, communication links (wired or wireless), displays or other visual or audio user interfaces, printing devices, and any other input/output interfaces, to provide the functions or achieve the results described herein. Except as otherwise explicitly or implicitly indicated herein, process or method steps described herein may be implemented within software modules (or computer programs) executed on one or more general-purpose computers. Specially designed hardware may alternatively be used to perform certain operations. Accordingly, any of the methods described herein may be performed by hardware, software, or any combination of these approaches. In addition, a computer-readable storage medium may store thereon instructions that when executed by a machine (such as a computer) result in performance according to any of the embodiments described herein.

In addition, computers or computer-based devices described herein may include any number of computing devices capable of performing the functions described herein, including but not limited to: tablets, laptop computers, desktop computers, smartphones, mobile communication devices, smart TVs, set-top boxes, e-readers/players, and the like.

Although the disclosure has been described herein using exemplary techniques, algorithms, or processes for implementing the present disclosure, it should be understood by those skilled in the art that other techniques, algorithms and processes or other combinations and sequences of the techniques, algorithms and processes described herein may be used or performed that achieve the same function(s) and result(s) described herein and which are included within the scope of the present disclosure.

Any process descriptions, steps, or blocks in process or logic flow diagrams provided herein indicate one potential implementation, do not imply a fixed order, and alternate implementations are included within the scope of the preferred embodiments of the systems and methods described herein in which functions or steps may be deleted or performed out of order from that shown or discussed, including substantially concurrently or in reverse order, depending on the functionality involved, as would be understood by those reasonably skilled in the art.

It should be understood that, unless otherwise explicitly or implicitly indicated herein, any of the features, functions, characteristics, alternatives or modifications described regarding a particular embodiment herein may also be applied, used, or incorporated with any other embodiment described herein. Also, the drawings herein are not drawn to scale, unless indicated otherwise.

Conditional language, such as, among others, "can," "could," "might," or "may," unless specifically stated otherwise, or otherwise understood within the context as used, is generally intended to convey that certain embodiments could include, but do not require, certain features, elements, or steps. Thus, such conditional language is not generally intended to imply that features, elements, or steps are in any way required for one or more embodiments or that one or more embodiments necessarily include logic for deciding, with or without user input or prompting, whether these features, elements, or steps are included or are to be performed in any particular embodiment.

Although the invention has been described and illustrated with respect to exemplary embodiments thereof, the foregoing and various other additions and omissions may be made therein and thereto without departing from the spirit and scope of the present disclosure.

The invention claimed is:

1. A method for storing data on a polymer in a nano-channel-based device, comprising:
   providing a nano-channel memory cell having at least two add nano-channels each of the add nano-channels arranged to allow the polymer to enter and exit the add channel and each of the add nano-channels arranged to add a unique code to the polymer when the polymer enters the respective add nano-channel, and a "deblock" nano-channel arranged to enable the polymer to receive the code when the polymer enters the respective add nano-channel;
   the polymer having a bead or origami on a non-writing end of the polymer;
   each add nano-channel having a nano-port constriction having a port width which allows the polymer to pass through the nano-port, and does not allow the bead to pass through and does not allow addition enzymes and deblock enzymes to pass through the nano-port; and
   successively steering the polymer from the "deblock" nano-channel to the add nano-channels to add the codes to the polymer based on a predetermined digital data pattern to create the digital data pattern on the polymer.

2. A method of claim 1 wherein the memory cell comprises a Y nano-channel cell.

3. A method of claim 1 wherein the memory cell comprises a three-leg nano-channel cell.

4. A method of claim 1 wherein the polymer comprises DNA.

5. A method of claim 1 wherein the addition enzymes and deblock enzymes are bonded to enzyme beads which cannot pass through the constriction.

6. A method of claim 1 further comprising providing an array of nano-channel memory cells.

7. A method for storing data on a polymer in a nano-channel-based device, comprising:
   providing a nano-channel memory cell having at least two add nano-channels each of the add nano-channels arranged to allow the polymer to enter and exit the add channel and each of the add nano-channels arranged to add a unique code to the polymer when the polymer enters the respective add nano-channel, and a "deblock" nano-channel arranged to enable the polymer to receive the code when the polymer enters the respective add nano-channel;

the polymer having a bead or origami on a non-writing end of the polymer;

each add nano-channel having a nano-port constriction having a port width which allows the polymer to pass through the nano-port, and does not allow the bead to pass through and does not allow enzyme beads attached to addition enzymes and deblock enzymes to pass through the nano-port; and successively steering the polymer from the "deblock" nano-channel to the add nano-channels to add the codes to the polymer based on a predetermined digital data pattern to create the digital data pattern on the polymer.

\* \* \* \* \*